(12) United States Patent
Jung et al.

(10) Patent No.: US 12,185,576 B2
(45) Date of Patent: Dec. 31, 2024

(54) DISPLAY DEVICE INCLUDING SUB-DAMS AND MULTI-LAYERED BANK

(71) Applicant: Samsung Display Co., Ltd., Yongin-Si (KR)

(72) Inventors: Eun Ae Jung, Hwaseong-si (KR); Eun Hye Kim, Namyangju-si (KR); Ki Ho Bang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 484 days.

(21) Appl. No.: 17/314,750

(22) Filed: May 7, 2021

(65) Prior Publication Data

US 2022/0131113 A1   Apr. 28, 2022

(30) Foreign Application Priority Data

Oct. 27, 2020   (KR) ......................... 10-2020-0140243

(51) Int. Cl.
*H10K 50/84*   (2023.01)
*G06F 3/041*   (2006.01)
(Continued)

(52) U.S. Cl.
CPC ......... *H10K 50/865* (2023.02); *G06F 3/0412* (2013.01); *H10K 50/844* (2023.02);
(Continued)

(58) Field of Classification Search
CPC ............... H10K 50/865; H10K 50/844; H10K 50/8445; H10K 50/86; H10K 50/8426; H10K 50/816; H10K 50/828; H10K 50/15; H10K 59/122; H10K 59/124; H10K 59/40; H10K 59/131; H10K 59/38; H10K 59/126;
(Continued)

(56) References Cited

U.S. PATENT DOCUMENTS 9,634,287 B1 * 4/2017 Shin ..................... G02F 1/1368
10,224,506 B2   3/2019 Shin
(Continued)

FOREIGN PATENT DOCUMENTS

CN   108039418 A  * 5/2018 ............... G09G 3/22
KR   10-0483385 B1   8/2005
(Continued)

*Primary Examiner* — Ida M Soward
(74) *Attorney, Agent, or Firm* — Innovation Counsel LLP

(57) ABSTRACT

A display device includes a substrate; an emission layer disposed on the substrate, and including emission areas and a pixel defining layer disposed between the emission areas and including a light blocking material; an encapsulation layer disposed on the emission layer, and including a first inorganic encapsulation film, an organic encapsulation film on the first inorganic encapsulation film, and a second inorganic encapsulation film on the organic encapsulation film; a dam surrounding the organic encapsulation film, including an organic material, and including a plurality of sub-dams; and a bank disposed to surround at least a portion of the dam, and including a first bank layer, a second bank layer on the first bank layer, a third bank layer on the second bank layer, and a fourth bank layer on the third bank layer, wherein the third bank layer includes the light blocking material.

16 Claims, 13 Drawing Sheets

(51) Int. Cl.
*H10K 50/844* (2023.01)
*H10K 50/86* (2023.01)
*H10K 59/12* (2023.01)
*H10K 59/122* (2023.01)
*H10K 59/124* (2023.01)
*H10K 59/40* (2023.01)
*H10K 77/10* (2023.01)
*G06F 3/044* (2006.01)
*H01L 27/146* (2006.01)
*H10K 50/15* (2023.01)
*H10K 50/816* (2023.01)
*H10K 50/828* (2023.01)
*H10K 59/131* (2023.01)
*H10K 59/38* (2023.01)

(52) U.S. Cl.
CPC ......... *H10K 59/122* (2023.02); *H10K 59/124* (2023.02); *H10K 59/40* (2023.02); *H10K 77/111* (2023.02); *G06F 3/04164* (2019.05); *G06F 3/0446* (2019.05); *G09G 2300/0408* (2013.01); *H01L 27/14678* (2013.01); *H10K 50/15* (2023.02); *H10K 50/816* (2023.02); *H10K 50/828* (2023.02); *H10K 59/131* (2023.02); *H10K 59/38* (2023.02)

(58) Field of Classification Search
CPC ........ H10K 77/111; H10K 2201/09909; H04L 27/14678; G06F 3/0412; G06F 3/04164; G06F 3/0446; G09G 2300/0408
See application file for complete search history.

(56) References Cited

U.S. PATENT DOCUMENTS

| | | | |
|---|---|---|---|
| 10,319,797 B2 * | 6/2019 | Kim | H10K 77/111 |
| 10,541,380 B1 * | 1/2020 | Sung | H10K 59/8731 |
| 10,720,604 B2 * | 7/2020 | Kim | H10K 59/00 |
| 10,777,771 B2 * | 9/2020 | Lee | H10K 59/122 |
| 10,886,326 B2 * | 1/2021 | Bang | H10K 59/131 |
| 10,886,339 B2 * | 1/2021 | Won | G06F 3/0412 |
| 10,930,884 B2 * | 2/2021 | Lee | H10K 50/8426 |
| 11,011,590 B2 * | 5/2021 | Kim | H10K 59/124 |
| 11,508,936 B2 * | 11/2022 | Kang | H10K 77/111 |
| 2015/0091030 A1 * | 4/2015 | Lee | H10K 59/124 438/34 |
| 2016/0149156 A1 * | 5/2016 | Kim | H10K 50/828 438/46 |
| 2016/0307971 A1 * | 10/2016 | Jeon | G09G 3/3233 |
| 2017/0331058 A1 * | 11/2017 | Seo | H10K 59/50 |
| 2018/0026225 A1 * | 1/2018 | Kwon | H10K 50/84 257/40 |
| 2018/0033832 A1 * | 2/2018 | Park | G06F 3/04164 |
| 2018/0040672 A1 * | 2/2018 | Park | H10K 59/88 |
| 2018/0151838 A1 * | 5/2018 | Park | G06F 3/0412 |
| 2019/0019966 A1 * | 1/2019 | Jiang | H10K 77/111 |
| 2019/0157618 A1 * | 5/2019 | Park | H10K 50/846 |
| 2019/0207157 A1 * | 7/2019 | Gong | H10K 59/122 |
| 2019/0214587 A1 * | 7/2019 | Kim | G09F 9/301 |
| 2019/0326375 A1 * | 10/2019 | Ochi | G09F 9/30 |
| 2020/0083306 A1 * | 3/2020 | Choi | H10K 50/8426 |
| 2020/0091256 A1 * | 3/2020 | Kim | H10K 50/844 |
| 2020/0127220 A1 * | 4/2020 | Kim | H10K 59/131 |
| 2020/0127231 A1 * | 4/2020 | Yun | H10K 59/40 |
| 2020/0136088 A1 * | 4/2020 | Yang | G09G 3/3225 |
| 2020/0152727 A1 * | 5/2020 | Shin | H10K 50/844 |
| 2020/0168685 A1 * | 5/2020 | Bang | H10K 59/131 |
| 2020/0176520 A1 * | 6/2020 | Kim | H10K 50/844 |
| 2020/0185647 A1 * | 6/2020 | Lee | G09G 3/3283 |
| 2020/0212114 A1 * | 7/2020 | Song | G06F 3/0445 |
| 2020/0335722 A1 * | 10/2020 | Kim | H10K 50/844 |
| 2020/0381653 A1 * | 12/2020 | Bang | H10K 50/844 |
| 2021/0134928 A1 * | 5/2021 | Bang | H10K 59/124 |
| 2021/0175470 A1 * | 6/2021 | Kang | H10K 50/844 |
| 2021/0193960 A1 * | 6/2021 | Song | H10K 50/844 |
| 2021/0257433 A1 * | 8/2021 | Bang | H10K 50/8426 |
| 2023/0011418 A1 * | 1/2023 | Long | H10K 50/844 |

FOREIGN PATENT DOCUMENTS

| | | | | |
|---|---|---|---|---|
| KR | 10-2017-0057911 A | 5/2017 | | |
| KR | 10-2018-0025308 A | 3/2018 | | |
| KR | 10-1873017 B1 | 7/2018 | | |
| KR | 10-2019-0019731 A | 2/2019 | | |
| KR | 10-2019-0042168 A | 4/2019 | | |
| KR | 10-2020-0018535 A | 2/2020 | | |
| KR | 20200036291 A | * | 4/2020 | .......... H10K 59/131 |

* cited by examiner

TG: G1, G2, G3, G4, G5
RX: RX1, RX2, RX3, RX4, RX5, RX6
TX: Tx1_1, Tx2_1, Tx3_1, Tx4_1, Tx1_2, Tx2_2, Tx3_2, Tx4_2
ES: ES1, ES2, ES3, ES4

DISPLAY DEVICE INCLUDING SUB-DAMS AND MULTI-LAYERED BANK

This application claims priority from Korean Patent Application No. 10-2020-0140243 filed on Oct. 27, 2020 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a display device and a manufacturing method of the display device.

2. Description of the Related Art

The importance of display devices is increasing with the development of multimedia. Accordingly, various types of display devices such as a liquid crystal display (LCD) and an organic light-emitting diode (OLED) display have been used.

Recently, a thin-film encapsulation (TFE) layer including an organic film and an inorganic film has been used as a part for sealing organic light-emitting elements to make an OLED display thinner and/or flexible.

At least one dam having a predetermined step may be formed on an outer side of a display device to which the thin-film encapsulation layer is applied. The at least one dam may prevent the overflow of the organic film of the thin-film encapsulation layer and support a mask for forming the thin-film encapsulation layer.

SUMMARY

Aspects of the present disclosure provide a display device capable of reducing reflection of external light, minimizing defects due to residual films, and easily performing mask alignment.

Aspects of the present disclosure provide a method of manufacturing the display device.

Although features of the present disclosure are set forth, other features of the present disclosure will be apparent to those skilled in the art from the following description.

An embodiment of a display device includes a substrate, an emission layer, an encapsulation layer, a dam, and a bank. The emission layer is disposed on the substrate, and includes a plurality of emission areas and a pixel defining layer. The pixel defining layer is disposed between the plurality of emission areas and includes a light blocking material. The encapsulation layer is disposed on the emission layer, and comprises a first inorganic encapsulation film, an organic encapsulation film on the first inorganic encapsulation film, and a second inorganic encapsulation film on the organic encapsulation film. The dam surrounds the organic encapsulation film. The dam includes an organic material and a plurality of sub-dams. The bank surrounds at least a portion of the dam, and includes a first bank layer, a second bank layer on the first bank layer, a third bank layer on the second bank layer, and a fourth bank layer on the third bank layer. The third bank layer includes the light blocking material.

An embodiment of a display device includes a substrate comprising a main region in which an image is displayed, a bending region connected to the main region, and a sub-region connected to the bending region. An encapsulation layer is disposed in the main region of the substrate and includes an organic film. A dam is disposed in the main region to surround the organic film. A bank is disposed in the bending region and comprising a first organic layer and a second organic layer on the first organic layer. The first organic layer is clad with the second organic layer, and the second organic layer forms an outermost side of the bank.

BRIEF DESCRIPTION OF THE DRAWINGS

The above and other aspects and features of the present disclosure will become more apparent by describing embodiments in detail with reference to the attached drawings.

DETAILED DESCRIPTION OF THE EMBODIMENTS

The inventive concept will now be described more fully hereinafter with reference to the accompanying drawings, in which embodiments are shown. The inventive concept may, however, be embodied in different forms. Rather, these embodiments are provided so that this disclosure will be thorough and complete, and will filly convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments will be described in detail with reference to the accompanying drawings.

Figure 1:
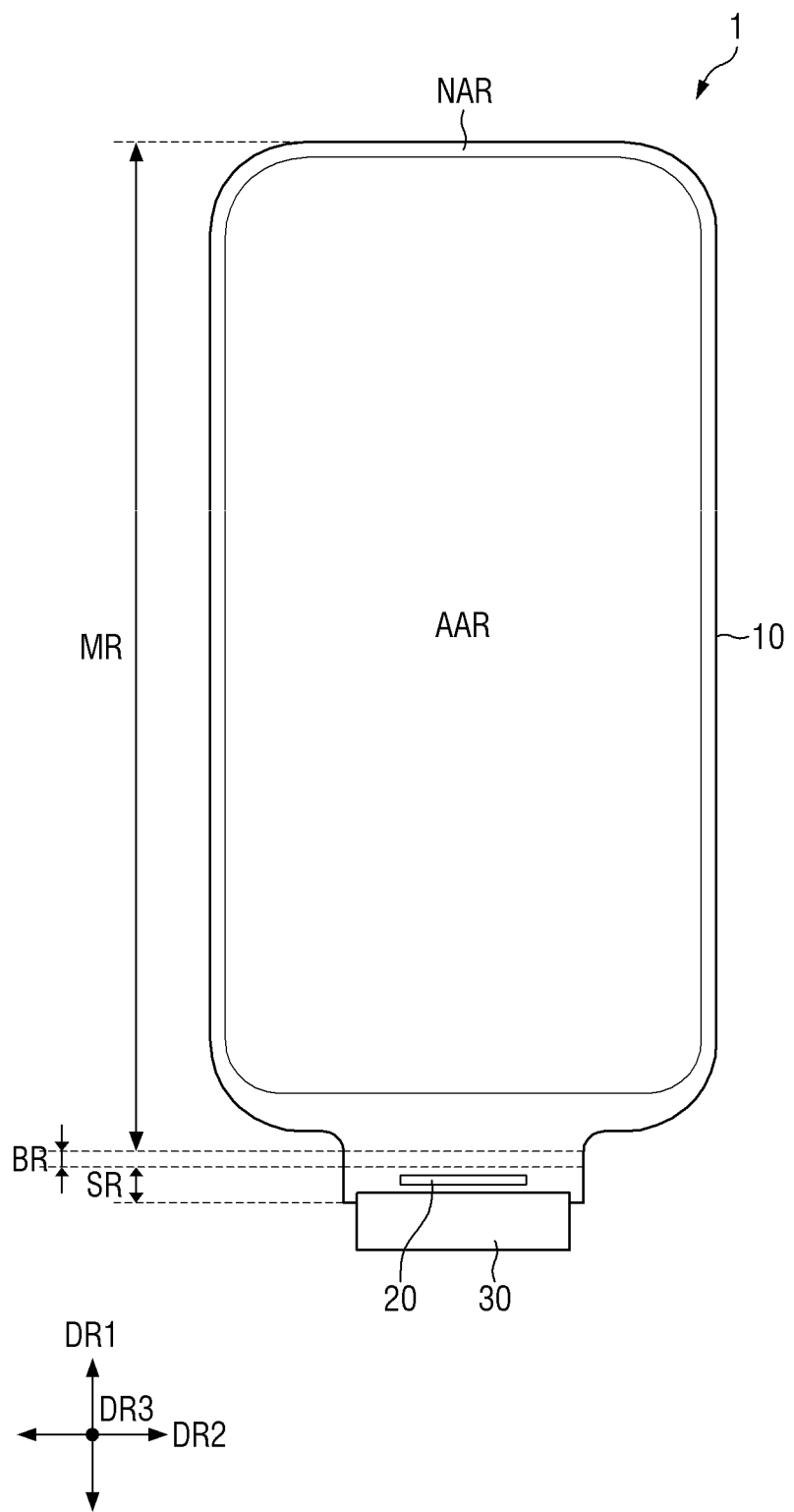
FIG. 1 is a plan layout of a display device according to an embodiment.
Figure 2:
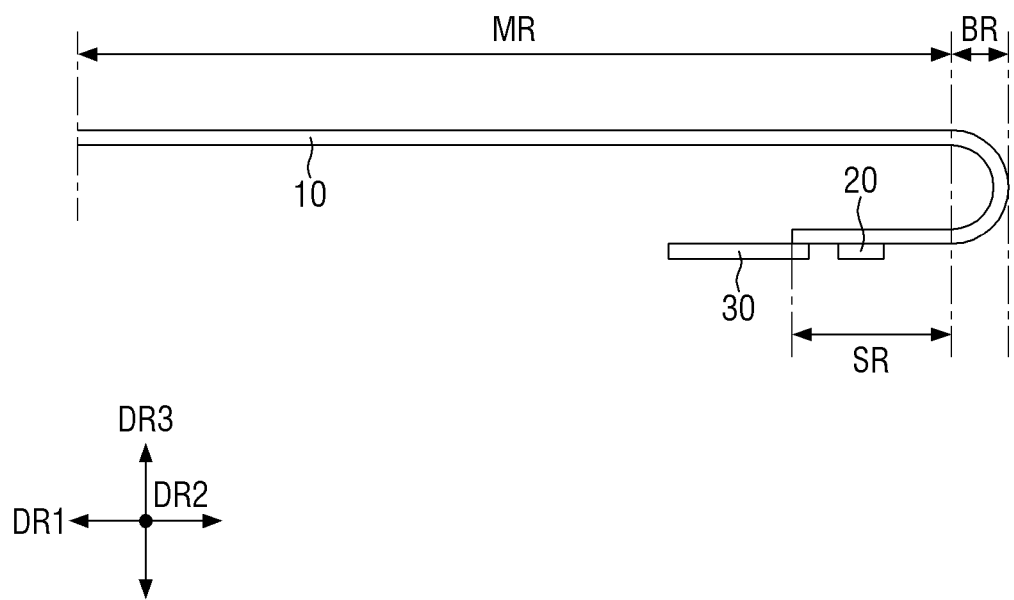
FIG. 2 is a schematic cross-sectional view of a display device according to an embodiment.

FIG. 1 is a plan layout of a display device 1 according to an embodiment. FIG. 2 is a schematic cross-sectional view of the display device 1 according to an embodiment.

In embodiments, a first direction DR1 and a second direction DR2 cross each other in different directions. In the plan view of FIG. 1, for convenience of description, the first direction DR1 and the second direction DR2 are defined as a vertical direction and a horizontal direction, respectively. In the following embodiments, one side of the first direction DR1 refers to an upward direction in a plan view, the other side of the first direction DR1 refers to a downward direction in the plan view. One side of the second direction DR2 refers to a right direction in the plan view, and the other side of the second direction DR2 refers to a left direction in the plan view. A third direction DR3, sometimes referred to as a thickness direction, is perpendicular to a plane defined by the first and second directions DR1 and DR2. However, the directions mentioned in the examples should be understood to mean relative directions and do not necessarily have a gravitational reference.

Referring to FIGS. 1 and 2, the display device 1 may refer to as any electronic device that provides a display screen. Examples of the display device 1 may include not only portable electronic devices providing a display screen, such as a mobile phone, a smart phone, a tablet personal computer (PC), an electronic watch, a smart watch, a watch phone, a mobile communication terminal, an electronic notebook, an e-book, a portable multimedia player (PMP), a navigation device, a game console, and a digital camera, but also a television, a notebook computer, a monitor, a billboard, an Internet-of-Things device, and the like.

Figure 4:
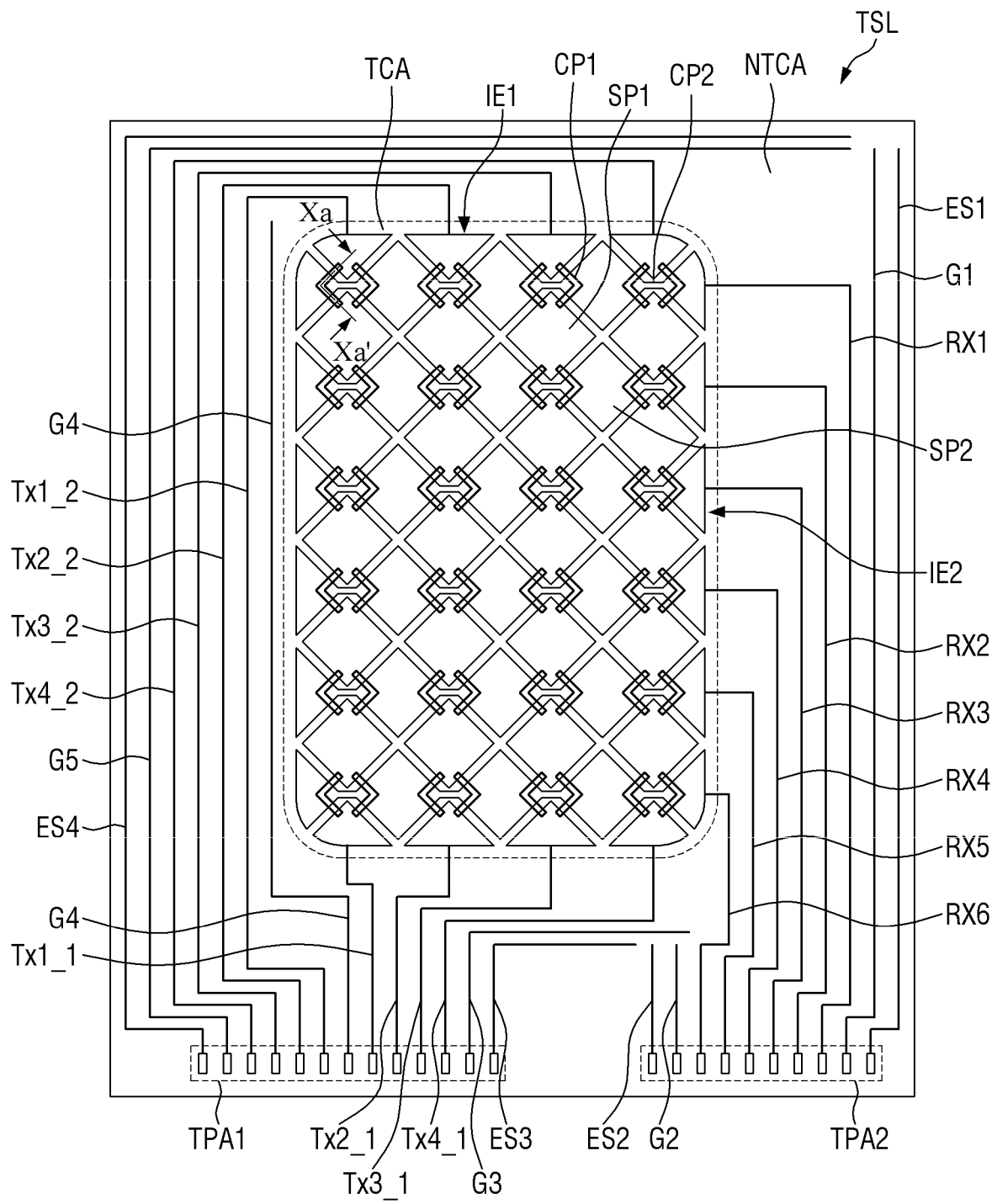
FIG. 4 is a schematic plan layout diagram of a touch layer according to an embodiment.
Figure 4:
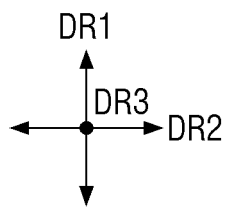

The display device 1 includes an active area AAR and an inactive area NAR. In the display device 1, an area in which a plurality of pixels are arranged to display a screen is defined as a display area, an area in which a screen is not displayed is defined as a non-display area. An area in which a touch input is sensed is defined as a touch area TCA which is illustrated in FIG. 4 and described further below. The display area and the touch area TCA may be included in the active area AAR. The display area and the touch area TCA may overlap each other. That is, the active area AAR may be an area in which display is performed and a touch input is sensed. A shape of the active area AAR may be a rectangle or a rectangle with rounded corners. The illustrated active region AAR has a rectangular shape which has rounded corners and which is longer in the first direction DR1 than in the second direction DR2. However, the active area AAR may have various shapes, such as a rectangular shape, a square shape, other polygonal shapes, a round shape, and an oval shape, e.g., which are longer in the second direction DR2 than in the first direction DR1.

The inactive area NAR is provided around the active area AAR. The inactive area NAR may be a bezel area. The inactive area NAR may surround all sides, e.g., four sides in FIG. 1, of the active area AAR. However, the inactive area NAR may not be provided, for example, in the vicinity of an upper side or a left or right side of the active area AAR.

In the inactive area NAR, signal wires for applying signals to the active area AAR (the display area or the touch area TCA) or driving circuits may be disposed. The inactive area NAR may not include a display area. Furthermore, the inactive area NAR may not include the touch area TCA. In an embodiment, the inactive area NAR may include a part of the touch area TCA, and a sensor member such as a pressure sensor may be disposed in the part of the touch area TCA. In some embodiments, the active area AAR may be the same as a display area in which a screen is displayed, and the inactive area NAR may be the same as a non-display area in which a screen is not displayed.

The display device 1 includes a display panel 10 that provides a display screen. Examples of the display panel 10 include an organic light-emitting diode display panel, a micro LED display panel, a nano LED display panel, a quantum dot emission display panel, a liquid crystal display panel, a plasma display panel, a field emission display panel, an electrophoretic display panel, an electrowetting display panel, and the like. A case in which an organic light-emitting diode display panel is applied as an example of the display panel 10 will be described below, but embodiments are applicable to other types of display panels when the same technical idea is applicable.

The display device 1 may further include a touch member that senses a touch input. The touch member may be provided in the form of a panel or film separate from the display panel 10 and attached to the display panel 10 but may be provided in the form of a touch layer TSL (see FIG. 3) inside the display panel 10. In the following embodiment, the touch layer TSL of FIG. 3 included as a touch member in the display panel 10 is illustrated.

The display panel 10 may include a flexible substrate including a flexible polymer material such as polyimide. Accordingly, the display panel 10 may be bent, folded, or rolled.

The display panel 10 may include a bending region BR in which the display panel 10 is bent. The display panel 10 may be divided into a main region MR located at one side of the bending region BR and a sub-region SR located at the other side of the bending region BR.

A display area of the display panel 10 is included in the main region MR. In an embodiment, a peripheral edge portion of the display area in the main region MR, the entire bending region BR, and the entire sub-region SR may be a non-display area. However, the bending region BR and/or the sub-region SR may also include a display area.

The main region MR may generally have a shape similar to a planar appearance of the display device 1. The main region MR may be a flat region located at a flat surface. However, at least one of edges of the main region MR excluding an edge, sometimes call a side, connected to the bending region BR may be bent to form a curved surface or may be bent in a vertical direction.

When at least one of the edges of the main region MR excluding the edge (side) connected to the bending region BR forms a curved surface or is bent, a display area may also be provided in the at least one edge. However, a curved surface or a bent edge may be a non-display area that does not display a screen or both a display area and a non-display area may be provided in the curved surface or the bent edge.

The bending region BR is connected to a side of the main region MR in the first direction DR1. For example, the bending region BR may be connected through a lower short side of the main region MR. A width of the bending region BR may be less than a width of a short side of the main region MR. Portions of the main region MR and the bending region BR, which are connected to each other, may have an L-shaped cut shape.

In the bending region BR, the display panel 10 may be bent with a curvature in a downward direction in the third direction DR3, i.e., in a direction opposite to the display surface. The bending region BR may have a certain radius of curvature. However, in an embodiment, each section of the bending region BR may have a different radius of curvature. As the display panel 10 is bent in the bending region BR, a surface of the display panel 10 may be reversed. That is, as illustrated in FIG. 2, a surface of the display panel 10 facing in the third direction DR3 in an upward direction from the main region MR may face the bending region BR in the first direction DR1 in a lateral (right in the view of FIG. 2) direction and face the sub-region SR in the third direction DR3 in a downward direction.

The sub-region SR extends from the bending region BR. The sub-region SR may extend in a direction parallel to the main region MR, starting from the end of bending region BR. The sub-region SR may overlap the main region MR in the thickness direction of the display panel 10. A width (width in the second direction DR2) of the sub-region SR may be the same as a width of the bending region BR, e.g. as shown in FIG. 1.

A driving chip 20 may be disposed in the sub-region SR. The driving chip 20 may include an integrated circuit for driving the display panel 10. The integrated circuit may include an integrated circuit for a display and/or an integrated circuit for a touch unit. The integrated circuit for a display and the integrated circuit for a touch unit may be provided as separate chips or integrated into one chip.

Figure 8:
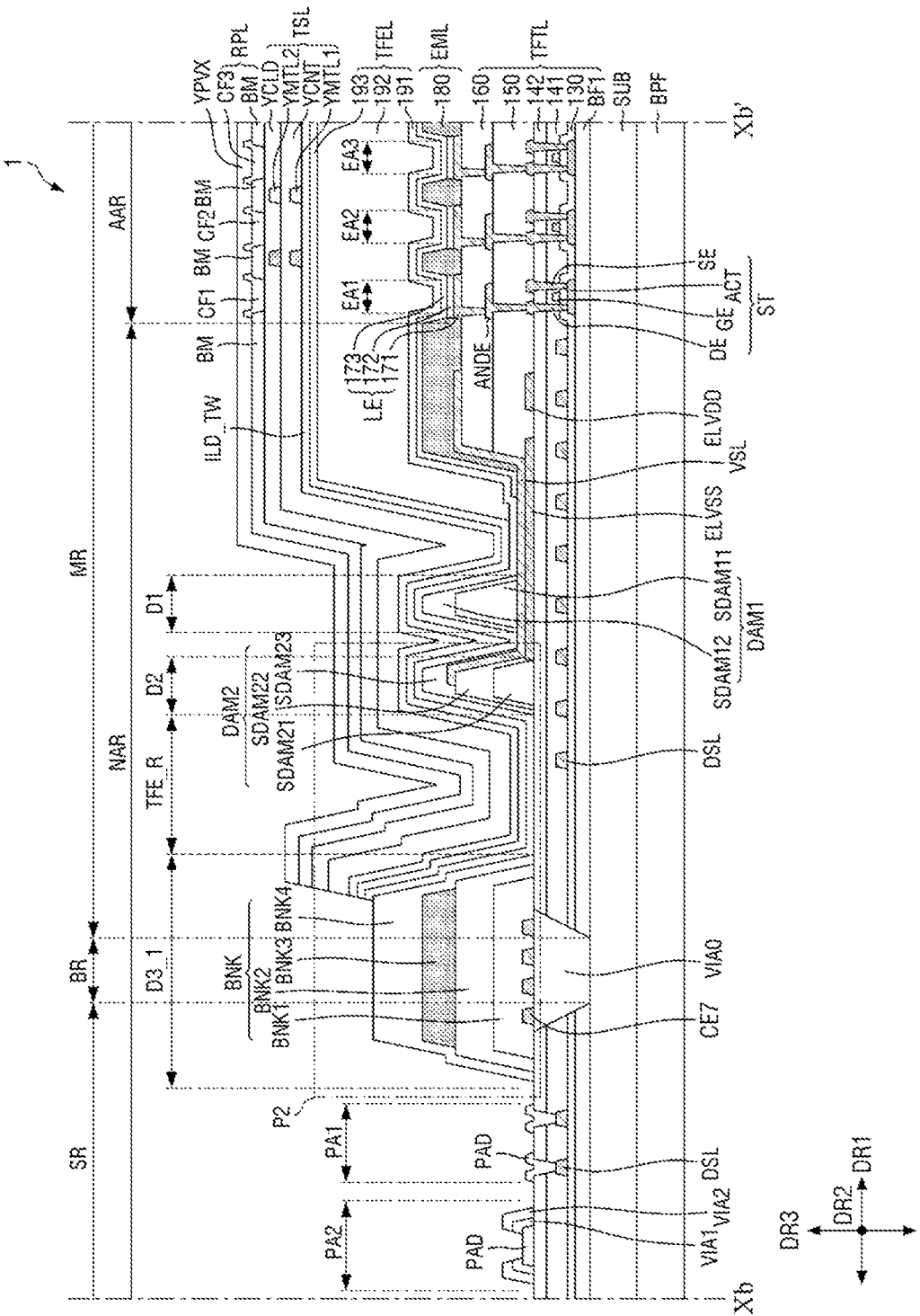
FIG. 8 is a cross-sectional view taken along line Xb-Xb' of FIG. 7.

Although not shown, a plurality of pad areas PA1 and PA2 of FIG. 8 may be provided at an end of the sub-region SR of the display panel 10 and may be connected to the driving chip 20 and/or a driving substrate 30. The driving substrate 30 may be a flexible printed circuit board or a film. The pad areas PA1 and PA2 may include display signal wire pads and touch signal wire pads.

Figure 3:
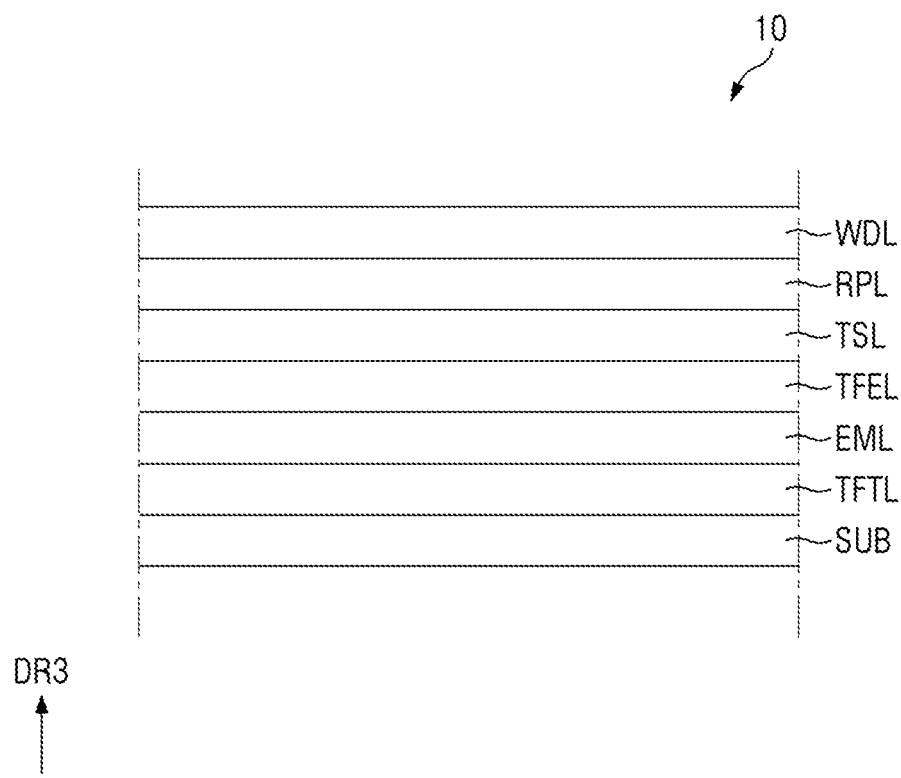
FIG. 3 is a schematic cross-sectional view of a stacked structure of a display panel according to an embodiment.

FIG. 3 is a schematic cross-sectional view of a stacked structure of the display panel 10 according to an embodiment.

Referring to FIG. 3, the display panel 10 may include a circuit driving layer TFTL, sometimes called a thin-film transistor layer TFTL, on a substrate SUB. The circuit driving layer TFTL may include a circuit for driving an emission layer EML of a pixel. The circuit driving layer TFTL may include a plurality of thin-film transistors.

The emission layer EML may be provided on the circuit driving layer TFTL. The emission layer EML may include an organic emission layer. The emission layer EML may emit light with various brightness levels according to a driving signal transmitted from the circuit driving layer TFTL.

An encapsulation layer TFEL may be provided on the emission layer EML. The encapsulation layer TFEL may include an inorganic layer or a stacked layer of an inorganic layer and an organic layer. As another example, glass, an encapsulation film, or the like may be applied as the encapsulation layer TFEL.

The touch layer TSL may be provided on the encapsulation layer TFEL. The touch layer TSL is a layer for detecting a touch input and may perform a function of a touch member.

An anti-reflection layer RPL may be provided on the encapsulation layer TFEL. The anti-reflection layer RPL may reduce the reflection of external light. The anti-reflection layer RPL may be implemented by a plurality of color filters CF1, CF2, and CF3 of FIG. 8 and a light blocking member BM of FIG. 8. Alternatively, the anti-reflection layer RPL may be replaced with a polarizing layer including a film-type polarizing member that polarizes incident light. The anti-reflection layer RPL may be omitted.

A protective layer WDL may be provided on the anti-reflection layer RPL. The protective layer WDL may include, for example, a window member. The protective layer WDL may be attached onto the anti-reflection layer RPL by an optically transparent adhesive or the like.

FIG. 4 is a schematic plan layout diagram of the touch layer TSL according to an embodiment.

Referring to FIG. 4, the touch layer TSL may include the touch area TCA located in the active area AAR and a non-touch area NTCA located in the inactive area NAR. In FIG. 4, although for convenience of description, an overall shape of the touch layer TSL is simplified and the non-touch area NTCA is shown as relatively wide, the shape of the touch area TCA and the shape of the non-touch area NTCA may be substantially the same as the shapes of the active area AAR and the inactive area NAR.

The touch area TCA of the touch layer TSL may include a plurality of first sensing electrodes IE1, sometimes called first touch electrodes IE1, and a plurality of second sensing electrodes IE2, sometimes called second touch electrodes IE2. One of the first and second sensing electrodes IE1 and IE2 may be a driving electrode and the other may be a sensing electrode. In the present embodiment, a case in which the first sensing electrodes IE1 are driving electrodes and the second sensing electrodes IE2 are sensing electrodes is illustrated.

The first sensing electrodes IE1 may extend in the first direction DR1. The first sensing electrodes IE1 may include a plurality of first sensors SP1 arranged in the first direction DR1 and a plurality of first connectors CP1 for electrically connecting adjacent first sensors SP1. The plurality of first sensing electrodes IE1 may be arranged in the second direction DR2.

The plurality of second sensing electrodes IE2 may extend in the second direction DR2. The second sensing electrodes IE2 may include a plurality of second sensors SP2 arranged in the second direction DR2 and a plurality of second connectors CP2 for electrically connecting adjacent second sensors SP2. The plurality of second sensing electrodes IE2 may be arranged in the first direction DR1.

A case in which four first sensing electrodes IE1 and six second sensing electrodes IE2 is illustrated. However, in an embodiment, the number of first sensing electrodes IE1 may be more or less than four and the number of second sensing electrodes IE2 may be more or less than six.

At least some of the first sensors SP1 and the second sensors SP2 may have a diamond shape. Some of the first sensors SP1 and the second sensors SP2 may have a shape obtained by cutting the diamond shape. For example, all of the first sensors SP1 and the second sensors SP2 excluding outermost first and second sensors in an extension direction have the diamond shape, and the outermost first and second sensors SP1 and SP2 may have a triangular shape obtained by cutting the diamond shape in half. The first sensors SP1 and the second sensors SP2 each having the diamond shape may be substantially the same in size and shape. The first sensors SP1 and the second sensors SP2 each having the triangular shape may be substantially the same in size and shape. However, the shapes and sizes of the first sensors SP1 and the second sensors SP2 may be variously changed.

By measuring a capacitance value between adjacent first and second sensors SP1 and SP2, whether a touch input has been performed is detected and a location of the touch input may be calculated as touch input coordinates. Touch sensing may be performed with a mutual cap method.

The first connectors CP1 may connect diamond or triangular corners of adjacent first sensors SP1. The second connectors CP2 may connect diamond or triangular corners of adjacent second sensors SP2. Widths of the first connectors CP1 and the second connectors CP2 may be less than those of the first sensors SP1 and the second sensors SP2.

A plurality of the first connectors CP1 may be provided. For example, a pair of first connectors CP1 may be disposed to overlap and pass one second sensor SP2 adjacent to one side of two first sensors SP1 connected by the pair of first connectors CP1 and another second sensor SP2 adjacent to the other side of the two first sensors SP1. Even when any one of the plurality of first connectors CP1 is disconnected due to static electricity or the like, the first sensing electrode IE1 corresponding to the disconnected one of the plurality of first connectors CP1 may be prevented from being disconnected.

The first sensing electrodes IE1 and the second sensing electrodes IE2 may be insulated and intersect each other. The first and second sensing electrodes IE1 and IE2 may be connected through a conductive layer in another layer in a region in which the first and second sensing electrodes IE1 and IE2 cross each other securing insulation between the first and second sensing electrodes IE1 and IE2. The insulated intersection of the first and second sensing electrodes IE1 and IE2 may be implemented by the first connector CP1 and/or the second connector CP2. For the insulated intersection, at least one of the first and second connectors CP1 and CP2 may be positioned in a different layer from the first and second sensing electrodes IE1 and IE2.

For example, the first sensor SP1 of the first sensing electrode IE1 and the second sensor SP2 of the second sensing electrode IE2 may be formed of a conductive layer positioned in the same layer and may not intersect or overlap each other. Adjacent first and second sensors SP1 and SP2 may be physically separated from each other.

The second connectors CP2 may be formed of the same conductive layer as the second sensors SP2 and connect adjacent second sensors SP2. Adjacent first sensors SP1 of the first sensing electrode IE1 may be physically separated from each other with respect to a region that the second connectors CP2 pass. The first connectors CP1 connecting the first sensors SP1 may be formed of a conductive layer different from the first sensors SP1 and cross a region of the second sensing electrode IE2. The first connectors CP1 may be electrically connected to adjacent first sensors SP1 through a contact hole.

A plurality of touch signal wires and are disposed in the inactive area NAR outside the touch area TCA. The plurality of touch signal wires and may extend from touch pad areas TPA1 and TPA2 in the sub-region SR to the inactive area NAR of the main region MR through the bending region BR.

The plurality of touch signal wires and include a plurality of touch driving wires TX and a plurality of touch sensing wires RX. In an embodiment, the plurality of touch signal wires may further include touch ground wires TG and/or touch anti-static wires ES.

The touch driving wires TX are connected to the first sensing electrodes IE1. In an embodiment, a plurality of touch driving wires TX may be connected to one first sensing electrode IE1. For example, the touch driving wires TX may include first touch driving wires TX1_1, TX2_1, TX3_1, and TX4_1 connected to lower ends of the first sensing electrodes IE1 and second touch driving wires TX1_2, TX2_2, TX3_2, and TX4_2 connected to upper ends of the first sensing electrodes IE1. The first touch driving wires TX1_1, TX2_1, TX3_1, and TX4_1 may extend from the touch pad area TPA1 to a side in the first direction DR1 to be connected to the lower ends of the first sensing electrodes IE1. The second touch driving wires TX1_2, TX2_2, TX3_2, and TX4_2 may extend from the touch pad area TPA1 to a side in the first direction DR1 to bypass a left edge of the touch area TCA, and thus be connected to the upper ends of the first sensing electrodes IE1.

The touch sensing wires RX are connected to the second sensing electrodes IE2. In an embodiment, one touch sensing wire RX may be connected to one second sensing electrode IE2. For example, the touch sensing wires RX may include touch sensing wires RX1, RX2, RX3, RX4, RX5, and RX6. Each of touch sensing wires RX1, RX2, RX3, RX4, RX5, and RX6 may extend from the touch pad area TPA2 to a side in the first direction DR1, extend to a right edge of the touch area TCA to be connected to a right end of the second sensing electrode IE2.

The touch anti-static wires ES may be disposed at outermost portions of the touch signal wiring. In an embodiment, the touch anti-static wires ES may include a first touch anti-static wire ES1, a second touch anti-static wire ES2, a third touch anti-static wire ES3, and a fourth touch anti-static wire ES4. The first to fourth touch anti-static wires ES1 to ES4 may surround the touch area TCA and the signal wires in a ring shape.

The first touch anti-static wire ES1 may cover the outside of the touch signal wiring located on the right side. The second touch anti-static wire ES2 may cover the inside of the touch signal wiring located on the right side. The third touch anti-static wire ES3 may cover the inside of the touch signal wiring located on the left side and the outside of the touch signal wiring extending in the second direction DR2 from a lower side of the touch area TCA. The fourth touch anti-static wiring ES4 may cover the outside of the touch signal wiring located on the left side and the outside of the touch signal wiring extending in the second direction DR2 from an upper side of the touch area TCA.

The touch ground wires TG may be located between signal wires. The touch ground wires TG may include a first touch ground wire G1, a second touch ground wire G2, a third touch ground wire G3, a fourth touch ground wire G4, and a fifth touch ground wire G5. The first touch ground wire G1 may be provided between the touch sensing wires RX and the first touch anti-static wire ES1. The second touch ground wire G2 may be provided between the second touch anti-static wire ES2 and the touch sensing wires RX. The third touch ground wire G3 may be provided between the first touch driving wires TX1_1, TX2_1, TX3_1, and TX4_1 and the third touch anti-static wire ES3. The fourth touch ground wire G4 may be provided between the first touch driving wires TX1_1, TX2_1, TX3_1, and TX4_1 and the second touch driving wires TX1_2, TX2_2, TX3_2, and TX4_2. The fifth touch ground wire G5 may be provided between the second touch driving wires TX1_2, TX2_2, TX3_2, and TX4_2 and the fourth touch anti-static wire ES4.

Figure 5:
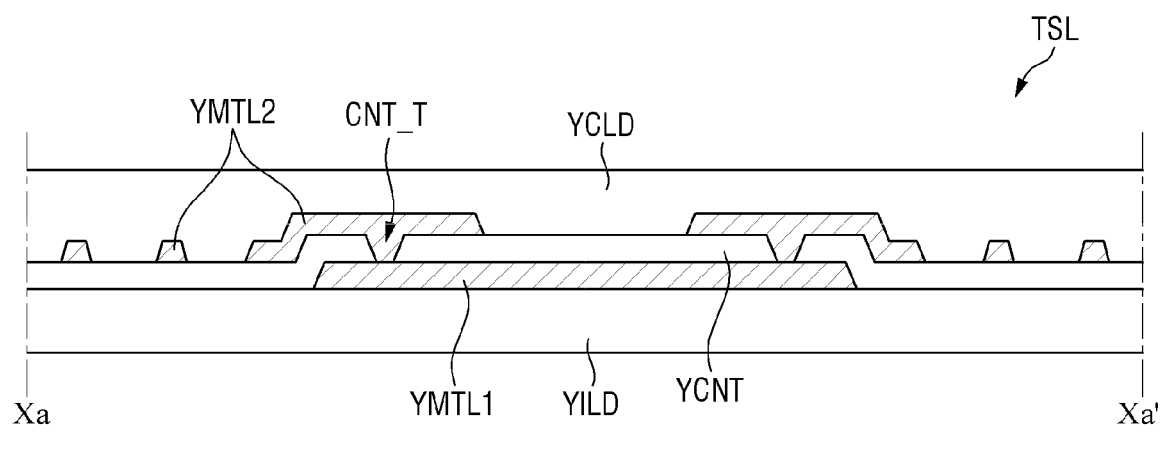
FIG. 5 is a cross-sectional view taken along line Xa-Xa' of FIG. 4.
Figure 5:
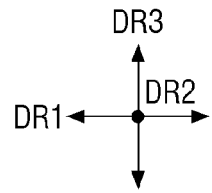

FIG. 5 is a cross-sectional view taken along line Xa-Xa' of FIG. 4.

Referring to FIG. 5, the touch layer TSL includes a base layer YILD, a first touch conductive layer YMTL1 on the base layer YILD, and a first touch insulating layer YCNT on the first touch conductive layer YMTL1, a second touch conductive layer YMTL2 on the first touch insulating layer YCNT, and a second touch insulating layer YCLD covering the second touch conductive layer YMTL2.

The base layer YILD may include an inorganic insulating material. Although not shown, the base layer YILD may be replaced with a second inorganic encapsulation film 193 of FIG. 8 constituting the encapsulation layer TFEL to be described below. For example, the base layer YILD may include a silicon nitride layer, a silicon oxynitride layer, a silicon oxide layer, a titanium oxide layer, an aluminum oxide layer, or the like.

The first touch conductive layer YMTL1 may be provided on the base layer YILD. The first touch conductive layer YMTL1 may be covered by the first touch insulating layer YCNT. The first touch insulating layer YCNT insulates the first touch conductive layer YMTL1 and the second touch conductive layer YMTL2. The second touch conductive layer YMTL2 may be provided on the first touch insulating layer YCNT. The second touch conductive layer YMTL2 may be covered by the second touch insulating layer YCLD.

Each of the first touch conductive layer YMTL1 and the second touch conductive layer YMTL2 may include a metal or a transparent conductive layer. The metal may include aluminum, titanium, copper, molybdenum, silver, or an alloy thereof. The transparent conductive layer may include a transparent conductive oxide, such as indium tin oxide (ITO), indium zinc oxide (IZO), zinc oxide (ZnO) or indium tin zinc oxide (ITZO), a conductive polymer such as PEDOT, metal nanowires, graphene, or the like.

The first touch conductive layer YMTL1 and/or the second touch conductive layer YMTL2 may include a multi-layered conductive layer. For example, the first touch conductive layer YMTL1 and/or the second touch conductive layer YMTL2 may have a three-layer structure of titanium/aluminum/titanium.

The first touch insulating layer YCNT and the second touch insulating layer YCLD may include an inorganic material or an organic material. In an embodiment, one of the first touch insulating layer YCNT and the second touch insulating layer YCLD may include the inorganic material and the other may include the organic material. In an embodiment, the first touch insulating layer YCNT may include a silicon nitride layer, a silicon oxynitride layer, a silicon oxide layer, a titanium oxide layer, an aluminum oxide layer, or the like. The second touch insulating layer YCLD may include at least one among an acrylic resin, a methacrylic resin, polyisoprene, a vinyl resin, an epoxy resin, a urethane resin, a cellulose resin, a siloxane resin, a polyimide resin, a polyamide resin and a perylene resin. However, both the first touch insulating layer YCNT and the second touch insulating layer YCLD may be formed of the inorganic material or the organic material.

Referring to FIGS. 4 and 5, the above-described first connector CP1 is formed of the first touch conductive layer YMTL1, and the first sensor SP1, the second sensor SP2, and the second connector CP2 may be formed of the second touch conductive layer YMTL2. However, the first connector CP1 may be formed of the second touch conductive layer YMTL2 and the sensors SP1 and SP2 and the second connector CP2 may be formed of the first touch conductive layer YMTL1 unlike that illustrated. The touch signal wires TX and RX may be formed of the first touch conductive layer YMTL1, the second touch conductive layer YMTL2, or the first and second touch conductive layers YMTL1 and YMTL2 that are connected through a contact hole. In addition, touch conductive layers constituting each of sensing electrodes or signal wires may be variously changed.

The first touch insulating layer YCNT may include a touch contact holes CNT_T. Portions of the first touch conductive layer YMTL1, e.g., the first connector CP1, and the second touch conductive layer YMTL2, e.g., the first sensor SP1, may be electrically connected through the touch contact holes CNT_T.

Figure 6:
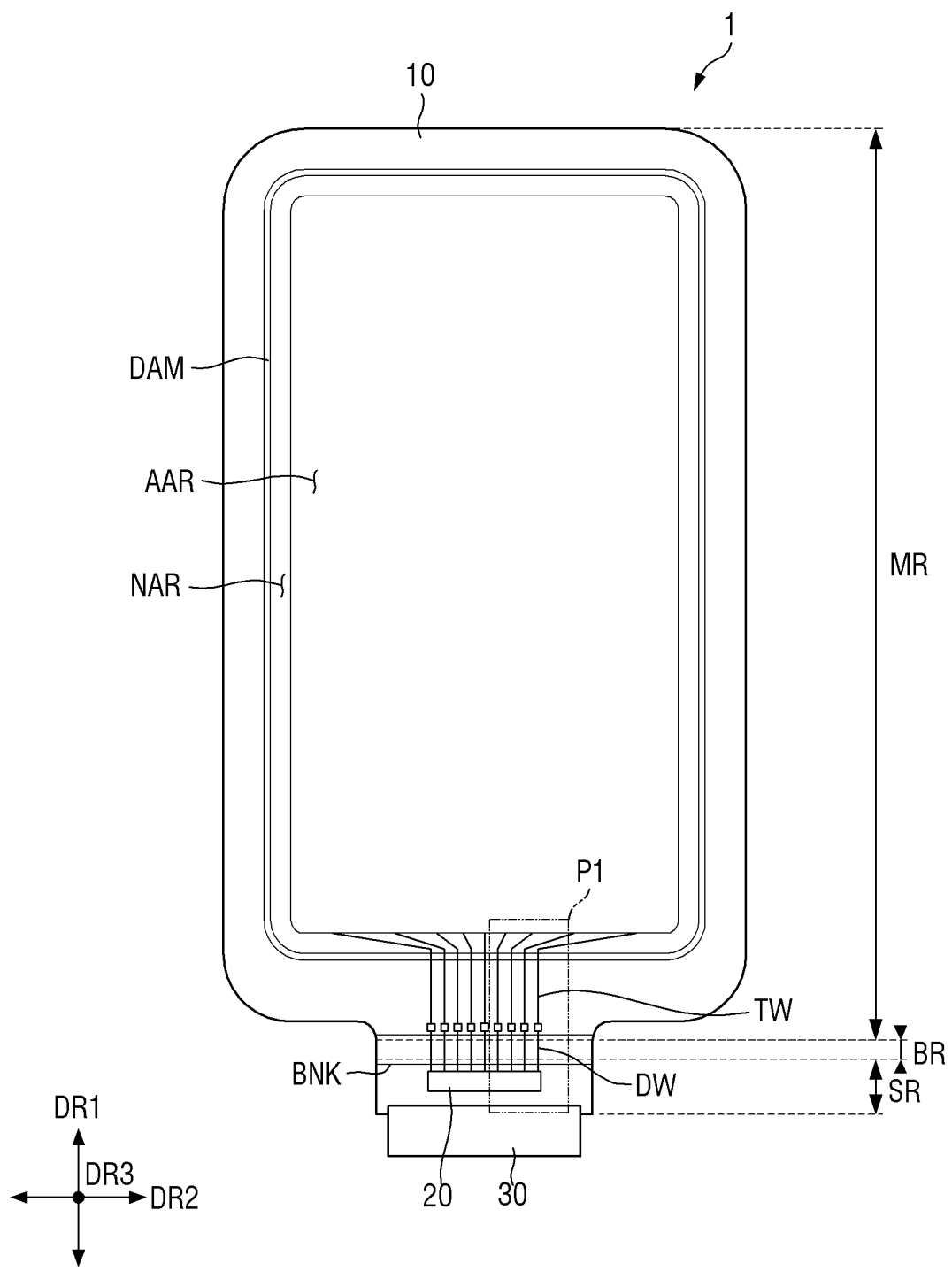
FIG. 6 is a plan view illustrating a configuration of a first dam and a second dam according to an embodiment.
Figure 7:
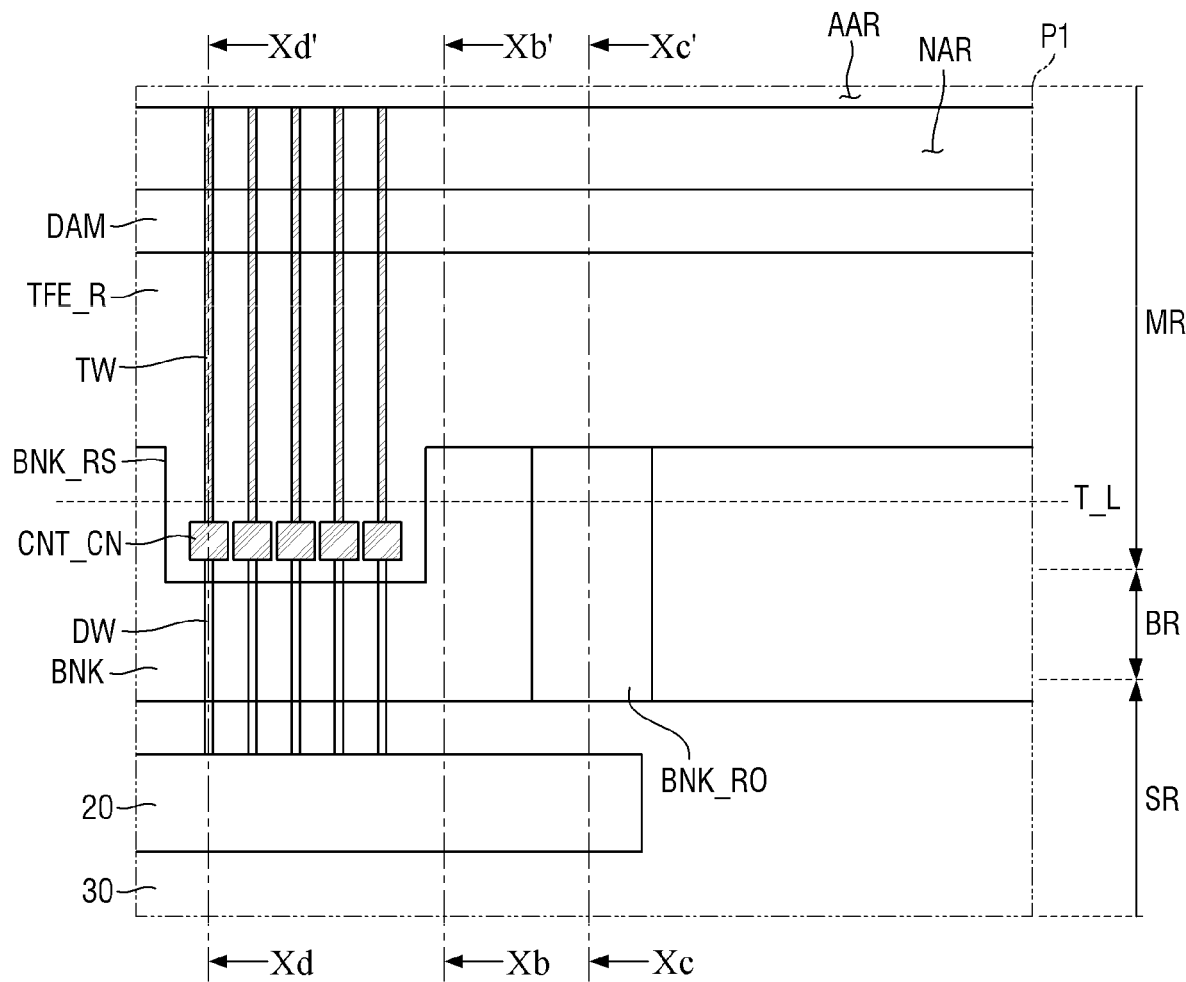
FIG. 7 is an enlarged plan view of a portion P1 of FIG. 6.
Figure 10:
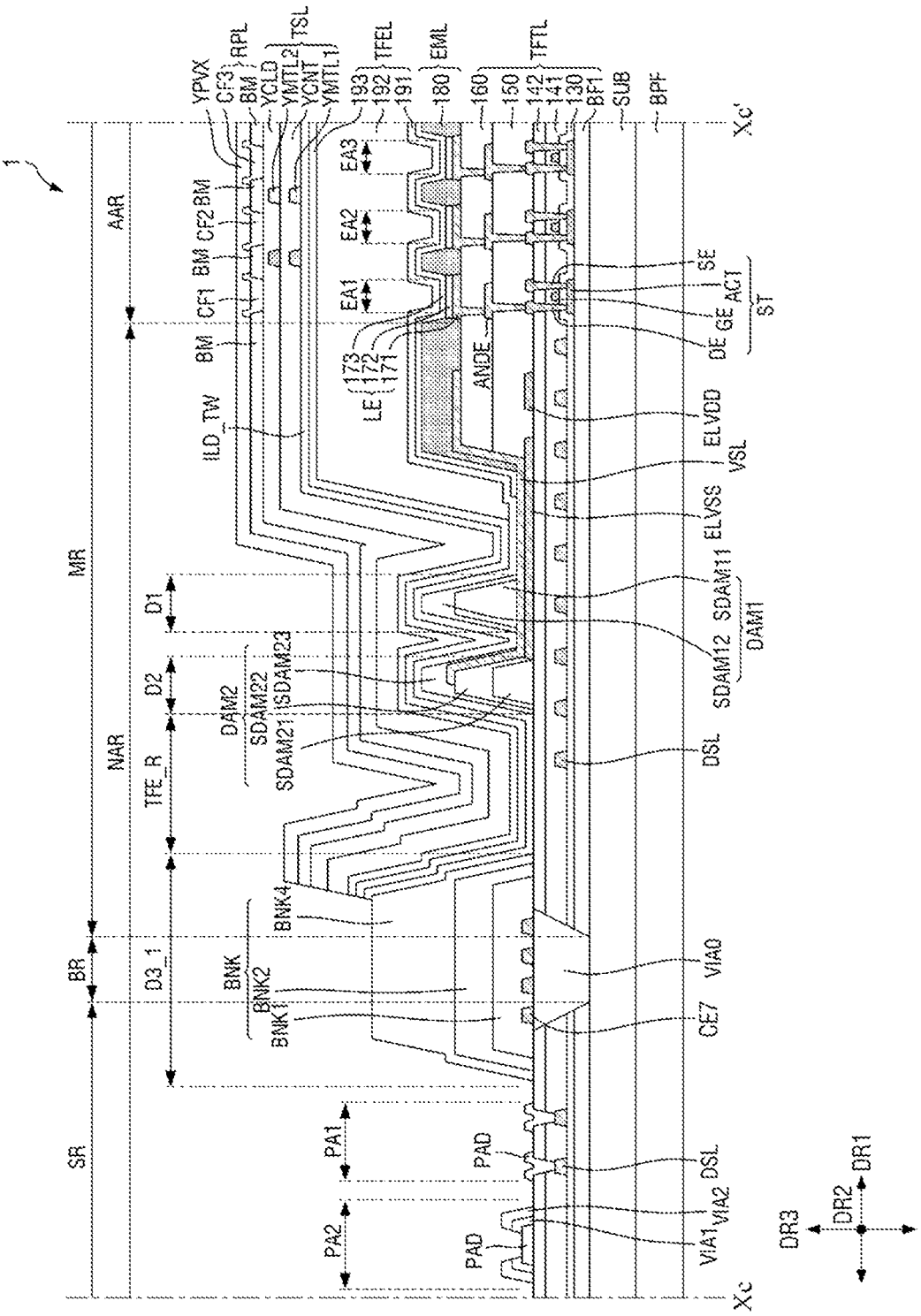
FIG. 10 is a cross-sectional view taken along line Xc-Xc' of FIG. 7.
Figure 11:
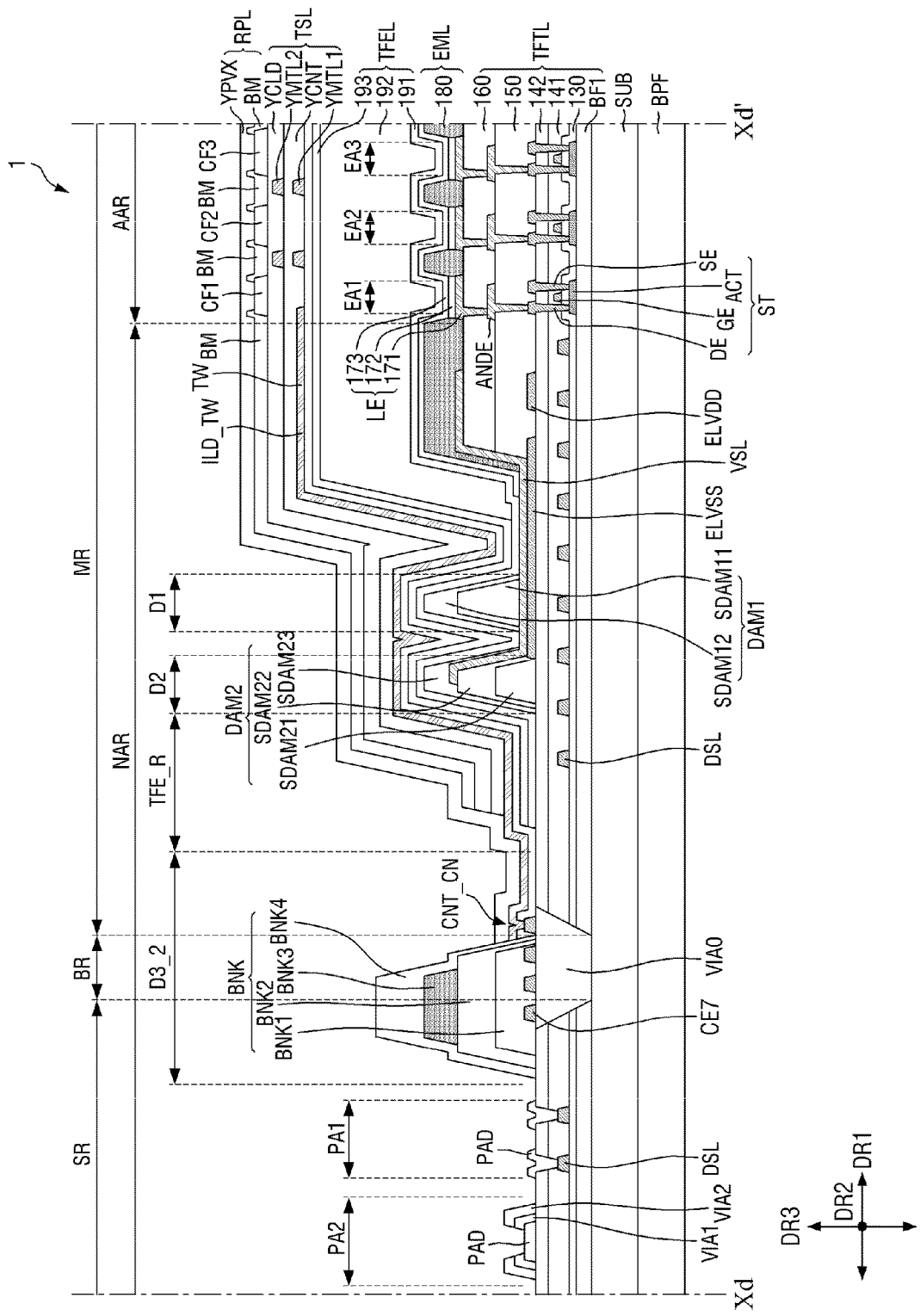
FIG. 11 is a cross-sectional view taken along line Xd-Xd' of FIG. 7.

FIG. 6 is a plan view conceptually illustrating a configuration of dams and banks according to an embodiment. FIG. 7 is an enlarged plan view of a portion P1 of FIG. 6. FIG. 8 is a cross-sectional view taken along line Xb-Xb' of FIG. 7. FIG. 9 is an enlarged cross-sectional view of a portion P2 of FIG. 8. FIG. 10 is a cross-sectional view taken along line Xc-Xc' of FIG. 7. FIG. 11 is a cross-sectional view taken along line Xd-Xd' of FIG. 7.

Referring to FIG. 6, a display panel 10 may further include a dam DAM and a bank BNK.

The dam DAM and the bank BNK may be provided in an inactive area NAR. The inactive area NAR may be a dead space in which an image or video is not displayed or a touch input is not sensed.

The dam DAM may be disposed in the inactive area NAR of a main region MR. The dam DAM may be provided to surround an active area AAR in a plan view. For example, the dam DAM may be provided in a band shape surrounding edges of the active area AAR, in the inactive area NAR. The dam DAM may be provided adjacent to the active area AAR rather than the bank BNK.

The bank BNK may be provided in a bending region BR and a sub-region BR. In detail, the bank BNK may be mainly disposed in the bending region BR and a part of the bank BNK may cross into the main region MR and/or the sub-region BR. The bank BNK may be provided to be more distant from the active area AAR than the dam DAM. In this case, the bank BNK may be provided to surround at least a portion of the dam DAM, for example, an outer side of the dam DAM, in the plan view. The bank BNK may be located between a driving chip 20 and the dam DAM in the plan view. At least a portion of the bank BNK is provided in the bending region BR to reduce the stress of the bending region BR when bent.

The dam DAM and the bank BNK may be provided to be spaced apart from each other in the plan view. As will be described below, in the thin-film encapsulation layer TFEL, an organic encapsulation film 192 of FIG. 8 may be omitted between the dam DAM and the bank BNK, and only an inorganic layer region TFE_R of FIG. 7 in which only a first inorganic encapsulation film 191 and the second inorganic encapsulation film 193 of FIG. 8 are disposed may be provided.

The bank BNK may include a recessed portion BNK_RS recessed toward a driving chip 20 and/or a driving substrate 30 in the plan view. A width of a portion of the bank BNK with the recessed portion BNK_RS formed may be less than a width of the remaining portion of the bank BNK in the plan view. The recessed portion BNK_RS may be formed over a first alignment line T_L to be described below. A contact hole CNT_CN may be provided in the recessed portion BNK_RS. The contact hole CNT_CN may be provided at a side at which the driving chip 20 and/or the driving substrate 30 are/is located based on the first alignment line T_L to be described below.

The dam DAM may prevent the overflow of the organic encapsulation film 192 of the encapsulation layer TFEL to be described below. The bank BNK may perform a function of supporting a mask for forming the encapsulation layer TFEL.

The dam DAM may include a plurality of dams DAM1 and DAM2 of FIG. 8. A configuration of the dam DAM will be described in detail with reference to FIG. 8 below.

Referring to FIGS. 6 and 7, the display panel 10 may further include a plurality of touch wires TW and a plurality of data wires DW.

The plurality of touch wires TW may be provided to cross the dam DAM. The dam DAM and the bank BNK may be provided to extend in one direction, e.g., the second direction DR2, and the plurality of touch wires TW may be provided to extend in another direction, e.g., the first direction DR1, crossing the direction in the plan view. In FIG. 7, the direction and the other direction are respectively illustrated as the second direction DR2 and the first direction DR1. One side of the plurality of touch wires TW may be located inside the dam DAM in which the active area AAR is located and may be connected to the active area AAR. The other side of the plurality of touch wires TW may be located outside the dam DAM, in which the bank BNK, the driving chip 20 and the driving substrate 30 are disposed, and may be connected to the plurality of data wires DW.

The plurality of data wires DW may be disposed to cross the bank BNK. The plurality of data wires DW may be disposed to extend in the other direction. One side of each of the plurality of data wires DW may be connected to one of the plurality of touch wires TW through the contact hole CNT_CN. The other side of each of the plurality of data wires DW may be connected to the driving chip 20.

The plurality of touch wires TW and/or the plurality of data wires DW may include the plurality of wires RX and TX and the touch anti-static wires ES of FIG. 4.

The dam DAM and/or the bank BNK may include a light blocking material or a light absorbing material that absorbs or reflects light in a specific wavelength band, for example, a visible light wavelength band, thus blocking transmission of the light.

The bank BNK may include a first region BNK_R0 in which the light blocking material is not disposed.

The first region BNK_R0 may be formed by partially removing a layer including the light blocking material among layers constituting the bank BNK. The layer including the light blocking material may be a third bank layer BNK3 of FIG. 8 to be described below.

The first region BNK_R0 may be provided in a region, in which the plurality of touch wires TW are not disposed, in the plan view. That is, the first region BNK_R0 may be provided not to overlap with the plurality of touch wires TW in the thickness direction. In FIGS. 6 and 7, the first region BNK_R0 is located in a portion of the bank BNK extending in the second direction DR2. The first region BNK_R0 may be located in a portion of the bank BNK extending in the first direction DR1 or a corner region at which the portion extending in the first direction DR1 and the portion extending in the second direction DR2 intersect each other in the plan view. The first region BNK_R0 may have a rectangular shape in the plan view. In embodiments, the first region BNK_R0 may have various shapes such as a circular shape, an oval shape, a polygonal shape, a stripe pattern shape, or an island pattern shape.

The bank BNK may be disposed to overlap the first alignment line T_L in the plan view. The first alignment line T_L may be a line with which the edges of a mask to be used in a deposition process for forming the encapsulation layer TFEL are aligned. In other words, at least a portion of the edges of the mask to be used in the deposition process may be aligned to be within the first region BNK_R0.

That is, in a display device according to an embodiment, the bank BNK includes the light blocking material and the first region BNK_R0 in which the light blocking material is not disposed and thus a boundary of the mask aligned on the bank BNK may be easily recognized. Accordingly, a connection failure between wires, e.g., between the touch wire TW and the data wire DW, and the like due to the formation of the encapsulation layer TFEL beyond the boundary of the mask may be prevented.

A stacked structure of the display panel 10 will be described in detail with further reference to FIGS. 8 to 11 below.

Referring to FIGS. 3, 8, 10, and 11, a circuit driving layer TFTL including a plurality of transistors ST, e.g., pixel transistors ST, may be disposed on an upper surface of the substrate SUB. A lower protective film BPF formed of an insulating material such as plastic may be disposed on a lower surface of the substrate SUB.

The circuit driving layer TFTL may include a pixel transistor ST, a buffer layer BF1, a gate insulating film 130, a first interlayer insulating film 141, a second interlayer insulating film 142, a first planarization film 150, and a second planarization film 160. Although not shown, the circuit driving layer TFTL may further include a scan transistor.

The pixel transistor ST may be disposed on the buffer layer BF1. The pixel transistor ST may include an active layer ACT, a gate electrode GE, a source electrode SE, and a drain electrode DE.

The active layer ACT may be disposed on the buffer layer BF1. The active layer ACT may include a silicon semiconductor such as polycrystalline silicon, single crystal silicon, low-temperature polycrystalline silicon, or amorphous silicon.

The gate insulating film 130 may be disposed on the active layer ACT. The gate insulating film 130 may be formed of an inorganic film, for example, a silicon nitride layer, a silicon oxynitride layer, a silicon oxide layer, a titanium oxide layer, or an aluminum oxide layer.

The gate electrode GE may be disposed on the gate insulating film 130. The gate electrode GE may overlap the active layer ACT in a thickness direction. The gate electrode GE may include a single layer or multiple layers formed of molybdenum (Mo), aluminum (Al), chromium (Cr), gold (Au), titanium (Ti), nickel (Ni), neodymium (Nd), copper (Cu), or an alloy thereof.

A plurality of data connection lines DSL may be disposed on the gate insulating film 130. The data connection lines DSL may be disposed in an inactive area NAR. The data connection lines DSL may be disposed in a main region MR and a sub-region SR. A data connection line DSL disposed at the first pad area PA1 and a data connection line DSL disposed between the bending region BR and the active area AAR may be electrically connected through a second connection electrode CE7 to be described below. The data connection line DSL disposed at the first pad part PA1 and a pad PAD may be electrically connected to each other.

The first interlayer insulating film 141 may be disposed on the gate electrode GE. The first interlayer insulating film 141 may be formed of an inorganic layer, for example, a silicon nitride layer, a silicon oxynitride layer, a silicon oxide layer, a titanium oxide layer, or an aluminum oxide layer. The first interlayer insulating film 141 may include a plurality of inorganic films.

The second interlayer insulating film 142 may be disposed on the first interlayer insulating film 141. The second interlayer insulating film 142 may be formed of an inorganic layer, for example, a silicon nitride layer, a silicon oxynitride layer, a silicon oxide layer, a titanium oxide layer, or an aluminum oxide layer.

The source electrode SE, the drain electrode DE, a low-voltage supply wire ELVSS, and a high-voltage supply wire ELVDD may be disposed on the second interlayer insulating film 142.

The source electrode SE, the drain electrode DE, the low-voltage supply wire ELVSS, and the high-voltage supply wire ELVDD may be formed of a single layer or multiple layers formed of molybdenum (Mo), aluminum (Al), chromium (Cr), gold (Au), titanium (Ti), nickel (Ni), neodymium (Nd), copper (Cu), or an alloy thereof.

The source electrode SE may be connected to a conductive region located at one side of the active layer ACT through a contact hole passing through the gate insulating film 130, the first interlayer insulating film 141, and the second interlayer insulating film 142. The drain electrode DE may be connected to a conductive region located at the other side of the active layer ACT through a contact hole passing through the gate insulating film 130, the first interlayer insulating film 141, and the second interlayer insulating film 142.

The first planarization film 150 may be disposed on the source electrode SE, the drain electrode DE, the low-voltage supply wire ELVSS, and the high-voltage supply wire ELVDD to flatten a step due to the thin-film transistor ST.

The first planarization film 150 may be formed of an organic film including an acrylic resin, an epoxy resin, a phenolic resin, a polyamide resin, a polyimide resin, or the like.

A first connection electrode ANDE and a first power supply wire VSL may be disposed on the first planarization film 150.

The first connection electrode ANDE may be connected to the source electrode SE or the drain electrode DE through a contact hole passing through the first planarization film 150.

The first power supply wire VSL may overlap a scan transistor in the thickness direction. The first power supply wire VSL may be connected to the low-voltage supply wire ELVSS through a contact hole passing through the first planarization film 150 and/or the second planarization film 160.

The first connection electrode ANDE and the first power supply wire VSL may be formed of a single layer or multiple layers formed of molybdenum (Mo), aluminum (Al), chromium (Cr), gold (Au), titanium (Ti), nickel (Ni), neodymium (Nd), copper (Cu) or an alloy thereof.

The second planarization film 160 may be disposed on the first connection electrode ANDE and the first power supply wire VSL. The second planarization film 160 may be formed of an organic film including an acrylic resin, an epoxy resin, a phenolic resin, a polyamide resin, a polyimide resin, or the like.

An emission layer EML may be disposed on the thin-film transistor layer TFTL. The emission layer EML may include light-emitting elements LE and a pixel defining layer 180.

Each of the light-emitting elements LE may include a pixel electrode 171, an organic layer 172, and a common electrode 173. In this case, the pixel electrode 171 may be an anode electrode and the common electrode 173 may be a cathode electrode.

The pixel electrode 171 may be disposed on the second planarization film 160. The pixel electrode 171 may be connected to the first connection electrode ANDE through a contact hole passing through the second planarization film 160.

In a top emission structure emitting light toward the common electrode 173 based on the organic layer 172, the pixel electrode 171 may be formed as a single layer using molybdenum (Mo), titanium (Ti), copper (Cu), or aluminum (Al) or may be formed as a stacked structure of aluminum and titanium (Ti/Al/Ti), a stacked structure of aluminum and ITO (ITO/Al/ITO), an APC alloy, an APC alloy, or a stacked structure of the APC alloy and ITO (ITO/APC/ITO) so as to increase reflectivity. The APC alloy is an alloy of silver (Ag), palladium (Pd), and copper (Cu).

The pixel defining layer 180 defines emission areas EA1, EA2, and EA3 of display pixels. The pixel defining layer 180 may be disposed between the emission areas EA1, EA2, and EA3.

The pixel defining layer 180 may be formed to expose a partial region of the pixel electrode 171 on the second planarization film 160. The pixel defining layer 180 may cover an edge of the pixel electrode 171. The pixel defining layer 180 may be disposed in a contact hole passing through the second planarization film 160. Accordingly, the contact hole passing through the second planarization film 160 may be filled with the pixel defining layer 180.

The pixel defining layer 180 may be formed of an organic film including an acrylic resin, an epoxy resin, a phenolic resin, a polyamide resin, a polyimide resin, or the like.

The pixel defining layer 180 may include a light blocking material or a light absorbing material that absorbs or reflects light in a specific wavelength band, for example, a visible light wavelength band, thus blocking transmission of the light. For example, the pixel defining layer 180 may include an organic film including a black dye or a black pigment or an opaque metal material such as chromium (Cr).

As the pixel defining layer 180 includes the light blocking material, the reflection of external light may decrease. In detail, as will be described below, when an anti-reflection layer RPL includes a plurality of color filters CF1, CF2, and CF3, transmissivity may increase and a thickness of a device may decrease but the reflection of external light may increase. Accordingly, the pixel defining layer 180 including the light blocking material may be provided to reduce the reflection of external light.

In each of the emission areas EA1, EA2, and EA3, the pixel electrode 171, the organic layer 172, and the common electrode 173 are sequentially stacked and thus holes from the pixel electrode 171 and electrons from the common electrode 173 are combined with each other in the organic layer 172, thus emitting light. The emission areas EA1, EA2, and EA3 may emit light of different colors. For example, the first emission area EA1 may emit light of a first color, the second emission area EA2 may emit light of a second color, and the third emission area EA3 may emit light of a third color. The first color may be red, the second color may be green, and the third color may be blue.

The organic layer 172 is disposed on the pixel electrode 171. The organic layer 172 may include an organic material and thus emit light of a certain color. For example, the organic layer 172 may include a hole transporting layer, an organic material layer, and an electron transporting layer. The organic material layer may include a host and a dopant. The organic material layer may include a material emitting a certain type of light and may be formed of a phosphorescent material or a fluorescent material.

The common electrode 173 is disposed on the organic layer 172. The common electrode 173 may cover the organic layer 172. The common electrode 173 may be a common layer formed in common for display pixels. A capping layer may be formed on the common electrode 173.

In a top emission structure, the common electrode 173 may be formed of a transparent conductive material (TCO), such as ITO or IZO, which transmits light or a semi-transmissive conductive material such as magnesium (Mg), silver (Ag), or an alloy of magnesium (Mg) and silver (Ag). When the common electrode 173 is formed of the semi-transmissive conductive material, light emission efficiency may increase due to micro cavities.

The encapsulation layer TFEL may be disposed on the emission layer EML. The encapsulation layer TFEL may include at least one inorganic layer to prevent oxygen or moisture from penetrating into the emission layer EML. In addition, the encapsulation layer TFEL may include at least one organic layer to protect the emission layer EML from foreign substances.

For example, the encapsulation layer TFEL may include a first inorganic encapsulation film 191 on the common electrode 173, an organic encapsulation film 192 on the first inorganic encapsulation film 191, and a second inorganic encapsulation film 193 on the organic encapsulation film 192. The first inorganic encapsulation film 191 and the second inorganic encapsulation film 193 may be formed by alternately stacking at least one inorganic film among a silicon nitride layer, a silicon oxynitride layer, a silicon oxide layer, a titanium oxide layer, and an aluminum oxide layer. The organic film may be an acrylic resin, an epoxy resin, a phenolic resin, a polyamide resin, or a polyimide resin.

A touch layer TSL may be disposed on the encapsulation layer TFEL. As described above, the touch layer TSL may include a first touch conductive layer YMTL1, a first touch insulating layer YCNT, a second touch conductive layer YMTL2, and a second touch insulating layer YCLD. As illustrated in FIG. 8, the first touch conductive layer YMTL1 and the second touch conductive layer YMTL2 may be disposed to overlap the pixel defining layer 180 in the thickness direction and not to overlap the plurality of emission areas EA1, EA2, and EA3.

The first touch conductive layer YMTL1 may be disposed on a touch wire insulating layer ILD_TW. The touch wire insulating layer ILD_TW may include the base layer YILD of FIG. 5. The touch wire insulating layer ILD_TW may be interposed between the encapsulation layer TFEL and the touch layer TSL.

In FIG. 8, a part of the touch wire insulating layer ILD_TW may be disposed to cross the bank BNK and an end of the touch wire insulating layer ILD_TW may be aligned with an end of the first inorganic encapsulation film 191 and/or an end of the second inorganic encapsulation film 193. The end of the first inorganic encapsulation film 191, the end of the second inorganic encapsulation film 193, and/or the end of the touch wire insulating layer ILD_TW may be located in the main region MR or the bending region BR between the bank BNK and the dam DAM or may be located in the sub-region SR outside the dam DAM.

Similarly, an end of each of the first touch insulating layer YCNT, the second touch insulating layer YCLD, a light blocking member BM, and an overcoat layer YPVX may be aligned with the end of the first inorganic encapsulation film 191 and/or the second inorganic encapsulation film 193. The end of each of the first touch insulating layer YCNT, the second touch insulating layer YCLD, the light blocking member BM, and the overcoat layer YPVX may be located in the main region MR or the bending region BR between the bank BNK and the dam DAM or may be located in the sub-region SR outside the dam DAM.

As illustrated in FIG. 11, the first touch conductive layer YMTL1 may include a touch wire TW. The touch wire TW may be mainly disposed in the inactive area NAR. The touch wire TW may be disposed to cross the active area AAR and the inactive area NAR. The touch wire TW may overlap the first dam DAM1 and the second dam DAM2 in the thickness direction.

One side of the touch wire TW may be located in the active area AAR and electrically connected to at least one of the first touch conductive layer YMTL1 and the second touch conductive layer YMTL2, which are located in the active area AAR. The other side of the touch wire TW may be located in the inactive area NAR and electrically connected to the second connection electrode CE7 through the contact hole CNT_CN. Although not shown, the touch wire TW may be electrically connected to the data connection line DSL.

The touch wire TW may be disposed on the touch wire insulating layer ILD_TW. Although not shown, the touch wire TW may be directly disposed on the second inorganic encapsulation film 193, the bank BNK, and the second interlayer insulating film 142. At least one layer insulating the touch wire TW may be further disposed on the touch wire TW. For example, the at least one layer may include at least one of the first touch insulating layer YCNT, the second touch insulating layer YCLD, the light blocking member BM, and the overcoat layer YPVX. As illustrated in FIG. 11, a portion of the touch wire TW may be interposed between the first touch insulation layer YCNT and the touch wire insulating layer ILD_TW and another portion of the touch wire TW may be interposed between the overcoat layer YPVX and the touch wire insulating layer.

An anti-reflection layer RPL may be disposed on the touch layer TSL. The anti-reflection layer RPL may include a plurality of color filters CF1, CF2, and CF3 for filtering light in a certain wavelength range, and a light blocking member BM disposed between the plurality of color filters CF1, CF2, and CF3 and including a light blocking material. The plurality of color filters CF1, CF2, and CF3 may include the first color filter CF1 that transmits first light and absorbs second light and third light, a second color filter CF2 that transmits the second light and absorbs the first light and the third light, and a third color filter CF3 that transmits the third light and absorbs the first light and the second light. The first color filter CF1, the second color filter CF2, and the third color filter CF3 may be disposed to respectively overlap the first emission area EA1, the second emission area EA2, and the third emission area EA3 in the thickness direction. The light blocking member BM may be disposed to overlap the pixel defining layer 180 in the thickness direction. The first light, the second light, and the third light may be respectively red light, green light, and blue light.

The display panel 10 may further include an overcoat layer YPVX for planarization on the first color filter CF1, the second color filter CF2, and the third color filter CF3. The overcoat layer YPVX may be formed of an organic film including an acrylic resin, an epoxy resin, a phenolic resin, a polyamide resin, a polyimide resin, or the like.

The dam DAM may include a first dam DAM1 and a second dam DAM2. Although not shown, the dam DAM may further include a third dam between the first dam DAM1 and the active area AAR.

The first dam DAM1 may be disposed more adjacent to the active area AAR than the second dam DAM2. The first dam DAM1 may be disposed between the second dam DAM2 and the active area AAR. A part of the low-voltage supply wire ELVSS and/or a part of the first power supply wire VSL may overlap the first dam DAM1 in the thickness direction.

The second dam DAM2 may be disposed more adjacent to the outside than the first dam DAM1. The second dam DAM2 may be disposed between the first dam DAM1 and the bank BNK. The second dam DAM2 may be a dam for confining the organic encapsulation film 192 that has exceeded the first dam DAM1.

The first dam DAM1 and the second dam DAM2 may have different widths. The widths may be maximum widths measured based on outermost sides of the first dam DAM1 and the second dam DAM2 in a plan view.

A width D1 of the first dam DAM1 may be less than a width D2 of the second dam DAM2. However, the width D1 of the first dam DAM1 may be the same as or greater than the width D2 of the second dam DAM2.

The first dam DAM1 and the second dam DAM2 may have a cross sectional shape tapering from bottom to top. Accordingly, widths of upper ends of the first and second dams DAM1 and DAM2 may be smaller than widths of lower ends of the first and second dams DAM1 and DAM2. However, the first and second dams DAM1 and DAM2 may have a substantially rectangular shape in a cross section.

The first dam DAM1 and the second dam DAM2 may have different heights. The height of the first dam DAM1 may be less than that of the second dam DAM2. However, the height of the first dam DAM1 may be the same as or greater than that of the second dam DAM2. The heights may refer to heights of upper portions of the first and second dams DAM1 and DAM2.

The first inorganic encapsulation film 191 and the second inorganic encapsulation film 193 may be disposed on the first dam DAM1 and the second dam DAM2. The first inorganic encapsulation film 191 and the second inorganic encapsulation film 193 may be in direct contact with the upper portion of the first dam DAM1, the upper portion of the second dam DAM2, and the inorganic region TFE_R between the first dam DAM1 and the second dam DAM2. Ends of the first inorganic encapsulation film 191 and the second inorganic encapsulation film 193 may be located outside the second dam DAM2. As illustrated in FIGS. 8 and 10, ends of the first inorganic encapsulation film 191 and the second inorganic encapsulation film 193 may be located on the bank BNK. As illustrated in FIG. 11, when a recessed BNK_RS is formed in the bank BNK, the ends of the first and second inorganic encapsulation films 191 and film 193 may be located between the bank BNK and the second dam DAM2.

The first dam DAM1 may include a first sub-dam SDAM11 and a second sub-dam SDAM12.

The first sub-dam SDAM11 may be disposed on the second interlayer insulating film 142. The first sub dam SDAM11 may be directly disposed on the low-voltage supply wire ELVSS and/or the first power supply wire VSL.

The second sub-dam SDAM12 may be disposed on the first sub-dam SDAM11. At least a portion of the second sub-dam SDAM12 may overlap the first sub-dam SDAM11 in the thickness direction.

A width of the second sub-dam SDAM12 may be greater than that of the first sub-dam SDAM11. The first sub-dam SDAM11 may be clad with the second sub-dam SDAM12. The second sub-dam SDAM12 may be a layer that forms an outermost side of the first dam DAM1. The second sub-dam SDAM12 may be disposed such that both sides of the second sub-dam SDAM12 are in contact with the first power supply wire VSL in a cross-section to completely cover an upper surface and both sides of the first sub-dam SDAM11. However, the second sub-dam SDAM12 may be disposed only on an upper surface of the first sub-dam SDAM11.

The first sub-dam SDAM11 and the second sub-dam SDAM12 may be formed of a transparent organic film. For example, the first sub-dam SDAM11 and the second sub-dam SDAM12 may be formed of an organic film including a photosensitive resin, an acrylic resin, an epoxy resin, a phenolic resin, a polyamide resin, a polyimide resin, or the like. The photosensitive resin may include a positive photoresist or a negative photoresist. In an embodiment, the first sub-dam SDAM11 and the second sub-dam SDAM12 may be formed of photosensitive polyimide, which is a positive photoresist.

The first sub-dam SDAM11 and the second sub-dam SDAM12 may not include a light blocking material. The light blocking material may be a material that absorbs or reflects light in a visible wavelength range, thus blocking transmission of the light. For example, the first sub-dam SDAM11 and the second sub-dam SDAM12 may not include an organic film including a black dye or a black pigment or an opaque metal material such as chromium (Cr).

The first sub-dam SDAM11 may be formed of the same material as the first planarization film 150 and the second sub-dam SDAM12 may be formed of the same material as the second planarization film 160. The first and second sub-dams SDAM11 and SDAM12 may be formed simultaneously with the first planarization film 150 and the second planarization film 160, respectively.

The first and second sub-dams SDAM11 and SDAM12 may not be formed of the same material as the pixel defining layer 180. Specifically, the pixel defining layer 180 may include the light blocking material but the first sub-dam SDAM11 and the second sub-dam SDAM12 may not include the light blocking material.

The second dam DAM2 may include a third sub-dam SDAM21, a fourth sub-dam SDAM22, and a fifth sub-dam SDAM23.

The third sub-dam SDAM21 may be disposed on the second interlayer insulating film 142. The third sub-dam SDAM21 may be in direct contact with the second interlayer insulating film 142.

The fourth sub-dam SDAM22 may be disposed on the third sub-dam SDAM21. At least a portion of the fourth sub-dam SDAM22 may overlap the third sub-dam SDAM21 in the thickness direction.

A width of the fourth sub-dam SDAM22 may be greater than that of the third sub-dam SDAM21. The third sub-dam SDAM21 may be clad with the fourth sub-dam SDAM22. The fourth sub-dam SDAM22 may completely cover an upper surface and both sides of the third sub-dam SDAM21 in a cross-sectional view. One end of the fourth sub-dam SDAM22 may be in contact with the second interlayer insulating film 142 and the other end of the fourth sub-dam SDAM22 may be in contact with the first power supply wire VSL. Although not shown, both ends of the fourth sub-dam SDAM22 may be in contact with the second interlayer insulating film 142. However, the fourth sub-dam SDAM22 may be disposed only on an upper surface of the third sub-dam SDAM21.

The fifth sub-dam SDAM23 may be disposed on the fourth sub-dam SDAM22. At least a portion of the fifth sub-dam SDAM23 may overlap the third sub-dam SDAM21 and the fourth sub-dam SDAM22 in the thickness direction. A part of the first power supply wire VSL may be interposed between the fifth sub-dam SDAM23 and the fourth sub-dam SDAM22.

The fifth sub-dam SDAM23 may have a larger width than the fourth sub-dam SDAM22. The fourth sub dam SDAM22 may be clad with the fifth sub-dam SDAM23. The fifth sub-dam SDAM23 may be a layer that forms an outermost side of the second dam DAM2. The fifth sub-dam SDAM23 may completely cover an upper surface and both sides of the fourth sub-dam SDAM22 in a cross-sectional view. One end of the fifth sub-dam SDAM23 may be in contact with the second interlayer insulating film 142 and the other end of the fifth sub-dam SDAM23 may be in contact with the first power supply wire VSL. Although not shown, both ends of the fifth sub-dam SDAM23 may be in contact with the second interlayer insulating film 142. However, the fifth sub-dam SDAM23 may be disposed only on the upper surface of the fourth sub-dam SDAM22.

The third sub-dam SDAM21, the fourth sub-dam SDAM22, and the fifth sub-dam SDAM23 may be formed of a transparent organic film.

The third sub-dam SDAM21, the fourth sub-dam SDAM22, and the fifth sub-dam SDAM23 may be formed of the same material as the first planarization film 150 and the second planarization film 160 (or the first sub-dam SDAM11 and the second sub dam SDAM12). The third sub-dam SDAM21 may be formed simultaneously with the first sub-dam SDAM11 and the first planarization film 150, and the fourth sub-dam SDAM22 may be formed simultaneously with second sub-dam SDAM12 and the second planarization film 160.

The fifth sub-dam SDAM23 may be formed of the same material as a fourth bank layer BNK4 to be described below. The fifth sub-dam SDAM23 may be formed simultaneously with the fourth bank layer BNK4.

The bank BNK is disposed closer to an edge of the display panel than the second dam DAM2. The bank BNK may be mainly disposed in the bending region BR and a part of the bank BNK may cross into the main region MR and the sub-region SR.

A width D3_1 of the bank BNK may be greater than the width of the first dam DAM1 and the width of the second dam DAM2. As illustrated in FIGS. 7 and 11, a width D3_2 of a portion of the bank BNK having the recessed portion BNK_RS may be less than the width D3_1 of the remaining portion of the bank BNK. In this case, the second connection electrode CE7 on a bending via layer VIA0 may be exposed, and the touch wire TW may be connected to the second connection electrode CE7 through the contact hole CNT_CN.

A height of the bank BNK may be greater than the height of the first dam DAM1 and the height of the second dam DAM2. The height of the bank BNK may refer to a height of an upper surface of the bank BNK.

The bank BNK may include a first bank layer BNK1, a second bank layer BNK2, a third bank layer BNK3, and a fourth bank layer BNK4, which are sequentially stacked in an upward direction.

The first bank layer BNK1 may be disposed on the second interlayer insulating film 142 and the bending via layer VIA0. Specifically, the buffer layer BF1, the gate insulating film 130, the first interlayer insulating film 141, and the second interlayer insulating film 142 may be removed from the bending region BR, and the substrate in the bending region BR may be filled with the via layer VIA0. The second connection electrode CE7 electrically connected to the data connection line DSL and/or the touch wire TW may be disposed on the bending via layer VIA0. The second connection electrode CE7 may include the data wire DW of FIGS. 6 and 7.

The second bank layer BNK2 may be disposed on the first bank layer BNK1. The first bank layer BNK1 may be clad with the second bank layer BNK2. The second bank layer BNK2 may be disposed such that both sides of the second bank layer BNK2 are in contact with the second interlayer insulating film 142 in a cross-sectional view to completely cover an upper surface and both sides of the first bank BNK1. However, the second bank layer BNK2 may be disposed only on the upper surface of the first bank layer BNK1.

The third bank layer BNK3 may be disposed on the second bank layer BNK2. The third bank layer BNK3 may have a width less than that of the second bank layer BNK2 and thus may be disposed only on the upper surface of the second bank layer BNK2. Accordingly, the third bank layer BNK3 may be spaced apart from the second interlayer insulating film 142. That is, the third bank layer BNK3 may be completely clad with the first bank layer BNK1 and the fourth bank layer BNK4.

The third bank layer BNK3 may include the same material as the pixel defining layer 180. The third bank layer BNK3 and the pixel defining layer 180 may be formed at the same time. The third bank layer BNK3 may include a light blocking material. As described above, the light blocking material may be a material that absorbs or reflects light in a visible wavelength range, thus blocking the transmission of the light. For example, the third bank layer BNK3 may include an organic film including a black dye or a black pigment, or an opaque metal material such as chromium (Cr).

The fourth bank layer BNK4 may be disposed on the third bank layer BNK3. The third bank layer BNK3 may be clad with the fourth bank layer BNK4. The fourth bank layer BNK4 may be a layer forming an outermost side of the bank BNK. The fourth bank layer BNK4 may be disposed such that both sides of the fourth bank layer BNK4 are in contact with the second interlayer insulating film 142 in a cross-sectional view to cover the sides of the second bank layer BNK2 and the sides and upper surface of the third bank layer BNK3. However, the fourth bank layer BNK4 may be disposed only on the upper surface of the third bank layer BNK3.

The first bank layer BNK1, the second bank layer BNK2, the third bank layer BNK3, and the fourth bank layer BNK4 may be organic layers or organic films each being formed of an organic material. That is, the first bank layer BNK1, the second bank layer BNK2, the third bank layer BNK3, and the fourth bank layer BNK4 may be respectively referred to as a first organic layer, a second organic layer, a third organic layer, and a fourth organic layer.

The first bank layer BNK1, the second bank layer BNK2, and the fourth bank layer BNK4 may be formed of a transparent organic film. For example, the first bank layer BNK1, the second bank layer BNK2, and the fourth bank layer BNK4 may be formed of an organic film including a photosensitive resin, an acrylic resin, an epoxy resin, a phenolic resin, a polyamide resin, a polyimide resin, or the like. The photosensitive resin may include a positive photoresist or a negative photoresist. In an embodiment, the first bank layer BNK1, the second bank layer BNK2, and the fourth bank layer BNK4 may be formed of photosensitive polyimide, which is a positive photoresist.

The first bank layer BNK1, the second bank layer BNK2, and the fourth bank layer BNK4 may not include a light blocking material. The light blocking material may be a material that absorbs or reflects light in a visible wavelength range, thus blocking transmission of the light. For example, the first bank layer BNK1, the second bank layer BNK2, and the fourth bank layer BNK4 may not include an organic film including a black dye or a black pigment or an opaque metal material such as chromium (Cr).

The first bank layer BNK1 and the second bank layer BNK2 may be formed of the same material as the first planarization film 150 and the second planarization film 160, respectively. The first bank layer BNK1 and the second bank layer BNK2 may be formed simultaneously with the first planarization film 150 and the second planarization film 160, respectively.

The first bank layer BNK1, the second bank layer BNK2, and the fourth bank layer BNK4 may not be formed of the same material as the pixel defining layer 180. Specifically, the pixel defining layer 180 may include a light blocking material but the first bank layer BNK1, the second bank layer BNK2, and the fourth bank layer BNK4 may not include the light blocking material.

Figure 9A:
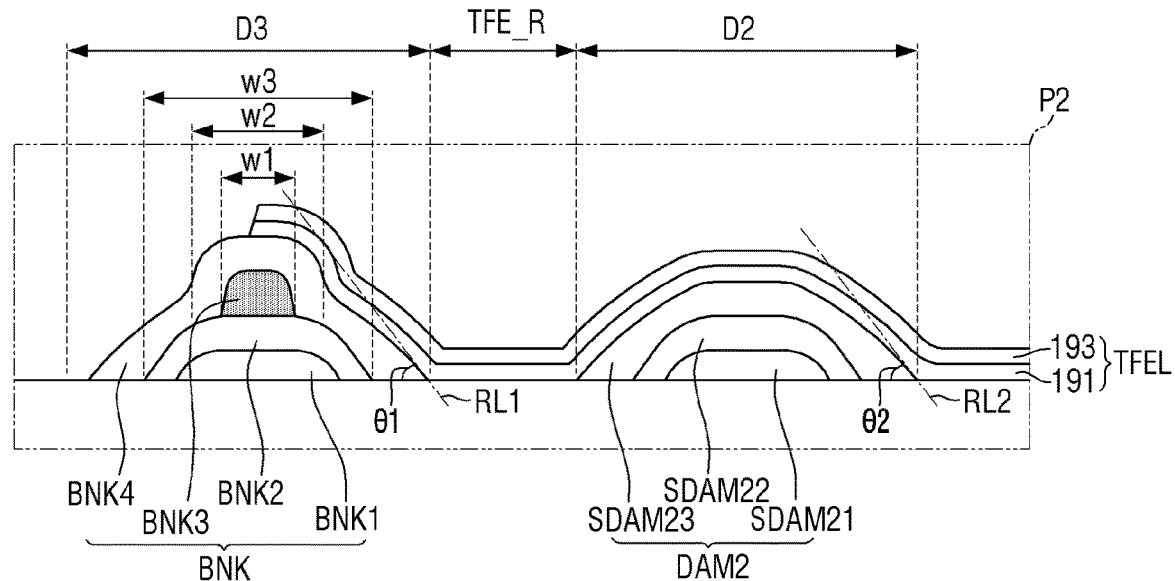
FIGS. 9A and 9B are enlarged cross-sectional views of a portion P2 of FIG. 8.
Figure 9B:
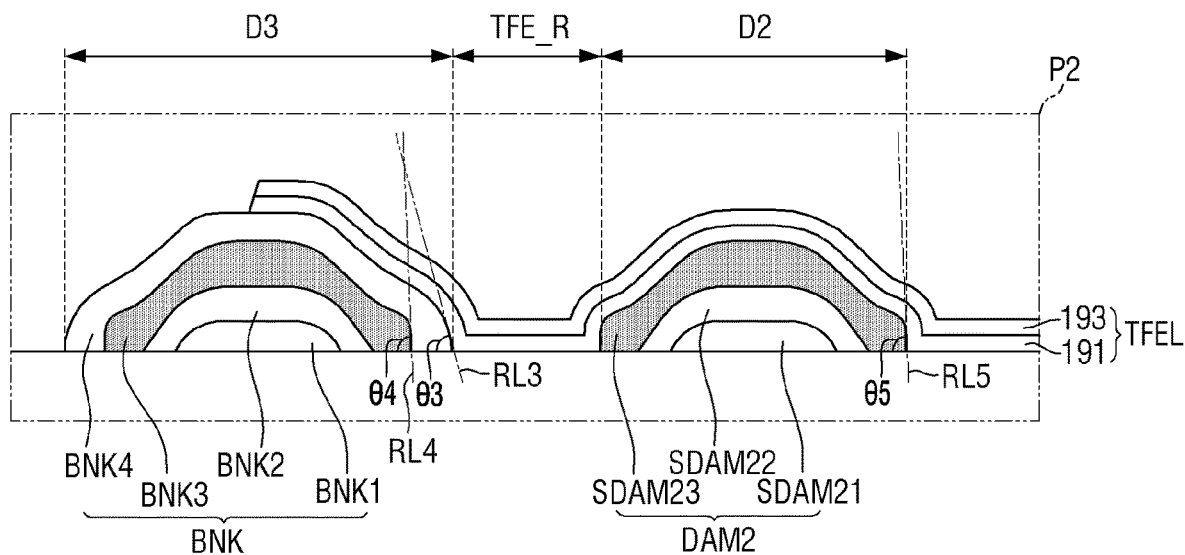

FIG. 9A is an enlarged cross-sectional view of a second dam DAM2 and a bank BNK according to an embodiment. FIG. 9B is a cross-sectional view illustrating a case in which a layer including a light blocking material is an outermost layer or is in direct contact with the second interlayer insulating film 142.

Hereinafter, a first angle θ1, a second angle θ2, a third angle θ3, a fourth angle θ4, and a fifth angle θ5 are angles measured based on the second interlayer insulating film 142. As illustrated in FIG. 8, the second interlayer insulating film 142 is disposed in parallel with a substrate SUB in a cross-sectional view and thus the first angle θ1, the second angle θ2, the third angle θ3, the third angle, the fourth angle θ4 and the fifth angle θ5 may be angles measured based on the substrate SUB.

Referring further to FIG. 9A, a layer including a light blocking material is not provided at outermost sides of a second dam DAM2 and a bank BNK and thus the outermost sides may be disposed with a gentle slope. The layer including the light blocking material may be a negative photoresist.

A third sub-dam SDAM21, a fourth sub-dam SDAM22, and a fifth sub-dam SDAM23 of the second dam DAM2 may be formed of an organic film that is formed of a positive photoresist.

The positive photoresist is excellent in etch resistance, hardly swells and is excellent in resolution, compared to a negative photoresist. Accordingly, the third sub-dam SDAM21, the fourth sub-dam SDAM22, and the fifth sub-dam SDAM23 may be disposed with a gentle slope on the second interlayer insulating film 142.

In detail, the surfaces of the edge of the fifth sub-dam SDAM23 forming the outermost side of the second dam DAM2 may form the first angle θ1 with respect to the second interlayer insulating film 142. For example, the first angle θ1 may be about 80° or less. Alternatively, the first angle θ1 may be in the range of about 5° to about 45°. Alternatively, the first angle θ1 may be in the range of about 10° to about 20°. As such, the fifth sub-dam SDAM23 may be disposed so as to form a step with little or a gentle slope on the second interlayer insulating layer 142. Accordingly, when the layer stacked on the fifth sub dam SDAM23 (for example, the first touch conductive layer YMTL1 or the second touch conductive layer YMTL2) is formed, a phenomenon in which a material constituting a layer stacked on the fifth sub-dam SDAM23 remains on the edge of the fifth sub-dam SDAM23 may be prevented.

The first angle θ1 may be an angle between a first reference line RL1 and the second interlayer insulating film 142, measured based on an outermost end of the fifth sub-dam SDAM23. The first reference line RL1 may pass the outermost end of the fifth sub dam SDAM23. The first reference line RL1 may be an average slope of or a tangent line at a portion of the fifth sub dam SDAM23 adjacent to the outermost end.

The first bank layer BNK1, the second bank layer BNK2, and the fourth bank layer BNK4 of the bank BNK may be organic films formed of a positive photoresist, and the third bank layer BNK3 may be an organic film formed of a negative photoresist.

The negative photoresist is superior to the positive photoresist in terms of thermal properties and chemical resistance but requires a strong corrosion solution and has a low resolution due to severe swelling. Accordingly, as shown in a left part of FIG. 9A, the edges of the third bank layer BNK3 may have a steep slope compared to the organic layer including the positive photoresist. However, as the fourth bank layer BNK4 formed of the positive photoresist is disposed on the third bank layer BNK3 to cover the edges of the third bank layer BNK3 having the steep slope, the edges of the bank BNK may have a relatively gentle slope. In detail, a first width w1 of the third bank layer BNK3 may be less than a second width w2 of the second bank layer BNK2. The first width w1 of the third bank layer BNK3 may be a maximum width measured based on an outermost end of the third bank layer BNK3. The first width w1 of the third bank layer BNK3 may be less than the second width w2 of an upper surface of the second bank layer BNK2. The upper surface of the second bank layer BNK2 may refer to a surface of the second bank layer BNK2 extending relatively flat in a horizontal direction.

A surface of the edges of the bank BNK may form the second angle θ2 with respect to the second interlayer insulating film 142. The second angle θ2 may be greater than or equal to the first angle θ1. For example, the second angle θ2 may be about 80° or less. Alternatively, the second angle θ2 may be in the range of about 5° to about 55°. Alternatively, the second angle θ2 may be in the range of about 10° to about 25°. As such, the bank BNK may be disposed so as to form a step with little or a gentle slope on the second interlayer insulating layer 142. Accordingly, when the layer stacked on the bank BNK (for example, the first touch conductive layer YMTL1 or the second touch conductive layer YMTL2) is formed, a phenomenon in which a material constituting a layer stacked on the bank BNK remains on the edge of the bank BNK may be prevented.

The second angle θ2 may be an angle between a second reference line RL2 measured based on the outermost end of the fourth bank layer BNK4 and the second interlayer insulating film 142. The second reference line RL2 may pass the outermost end of the fourth bank layer BNK. The second reference line RL2 may be an average slope of or a tangent line at a portion of the fourth bank layer BNK4 adjacent to the outermost end.

On the other hand, referring to FIG. 9B, when the fifth sub-dam SDAM23 forming an outermost side of the second dam DAM2 includes a negative photoresist, the edges of the fifth sub-dam SDAM23 may have a steep slope on the second interlayer insulating film 142. In detail, surfaces of the edges of the fifth sub-dam SDAM23 may be form the third angle θ3 with respect to the second interlayer insulating film 142. For example, the third angle θ3 may be about 45° or more. Alternatively, the third angle θ3 may be in the range of about 70° or about 80° or more. As such, when the edge of the fifth sub-dam SDAM23 is disposed so as to have a steep slope in the second interlayer insulating layer 142, the edge of the second dam DAM2 can be more easily and clearly recognized for machine vision or the like.

When the third bank layer BNK3 of the bank BNK includes a negative photoresist and has a larger width than the second bank layer BNK2 and thus is in contact with the second interlayer insulating film 142, the edges of the third bank layer BNK3 may have a sharp slope on the second interlayer insulating film 142. In detail, surfaces of the edges of the third bank layer BNK3 may form the fourth angle θ4 with respect to the second interlayer insulating film 142. The fourth angle θ4 may be substantially the same as or similar to the third angle θ3.

Accordingly, the surfaces of the edge of the fourth bank layer BNK4 may have a relatively steep slope with respect to the second interlayer insulating film 142. In detail, the surfaces of the edges of the fourth bank layer BNK4 may form the fifth angle θ5 with respect to the second interlayer insulating film 142. For example, the fifth angle θ5 may be about 25° or more. Alternatively, the fifth angle θ5 may be in the range of about 25° to about 80°. As such, the fourth bank layer BNK4 may be disposed so as to form a step with little or a gentle slope on the second interlayer insulating layer 142. Accordingly, when the layer stacked on the fourth bank layer BNK4 (for example, the first touch conductive layer YMTL1 or the second touch conductive layer YMTL2) is formed, a phenomenon in which a material constituting a layer stacked on the fourth bank layer BNK4 remains on the edge of the fourth bank layer BNK4 may be prevented.

The third angle θ3 may be an angle between a third reference line RL3 measured based on the outermost end of the fifth sub-dam SDAM23 and the second interlayer insulating film 142. The fourth angle θ4 may be an angle between a fourth reference line RL4 measured based on the outermost end of the third bank layer BNK3 and the second interlayer insulating film 142. The fifth angle θ5 may be an angle between a fifth reference line RL5 measured based on the outermost end of the fourth bank layer BNK4 and the second interlayer insulating film 142. The third angle θ3, the fourth angle θ4, and the fifth angle θ5 may be angles substantially the same as or similar to the first angle θ1 or the second angle θ2.

That is, in the display device 1 according to an embodiment, the first inorganic encapsulation film 191 and the second inorganic encapsulation film 193 may be provided to have a gentle slope corresponding to the shapes of the upper surfaces of the third bank layer BNK3 and the fourth bank layer BNK4, which form the outermost sides of the second dam DAM2 and the bank BNK. In this manner, the occurrence of defects due to a gap between the first inorganic encapsulation film 191 and the second inorganic encapsulation film 193 or the remainder of a layer, e.g., the touch wire TW, stacked on the second inorganic encapsulation film 193 is prevented.

Although FIGS. 9A, 9B illustrate the second dam DAM2 among the plurality of dams DAM, in an embodiment, the adjustment of the angle of the edges of the second dam DAM2 (or the fifth sub-dam SDAM23) may also apply to the first dam DAM1. For example, when the first sub-dam SDAM11 of the first dam DAM1 includes a negative photoresist (a light blocking material), the first sub-dam SDAM11 may be clad with the second sub-dam SDAM12, which includes a positive photoresist, to adjust the angle of the surfaces of the edges of the first dam DAM1 to be gentle.

Referring to FIGS. 7 and 10, as described above, a layer including the light blocking material may not be provided in the first region BNK_R0 of the bank BNK. The layer including the light blocking material may be the third bank layer BNK3. As described above, the third bank layer BNK3 may include the negative photoresist.

In the first region BNK_R0, the first bank layer BNK1, the second bank layer BNK2, and the fourth bank layer BNK4 may be sequentially stacked upward. In the first region BNK_R0, the second bank layer BNK2 may be in direct contact with the first bank layer BNK1 and the fourth bank layer BNK4 may be in direct contact with the second bank layer BNK2.

A height of the bank BNK in the first region BNK_R0 may be less than or equal to heights of the bank BNK in the other regions. A width D3_1 of the bank BNK in the first region BNK_R0 may be less than or equal to a width D3_1 of the bank BNK in the other regions.

Although not shown, the third bank layer BNK3 may be disposed in the first region BNK_R0 of the bank BNK and the light blocking material may be removed from only a part of the third bank layer BNK3 disposed in the first region BNK_R0.

As described above, because the light blocking material is not disposed in some regions of the bank BNK, a boundary of a mask overlapping in the first region BNK_R0 may be easily recognized in a deposition process of forming the encapsulation layer TFEL.

Figure 12:
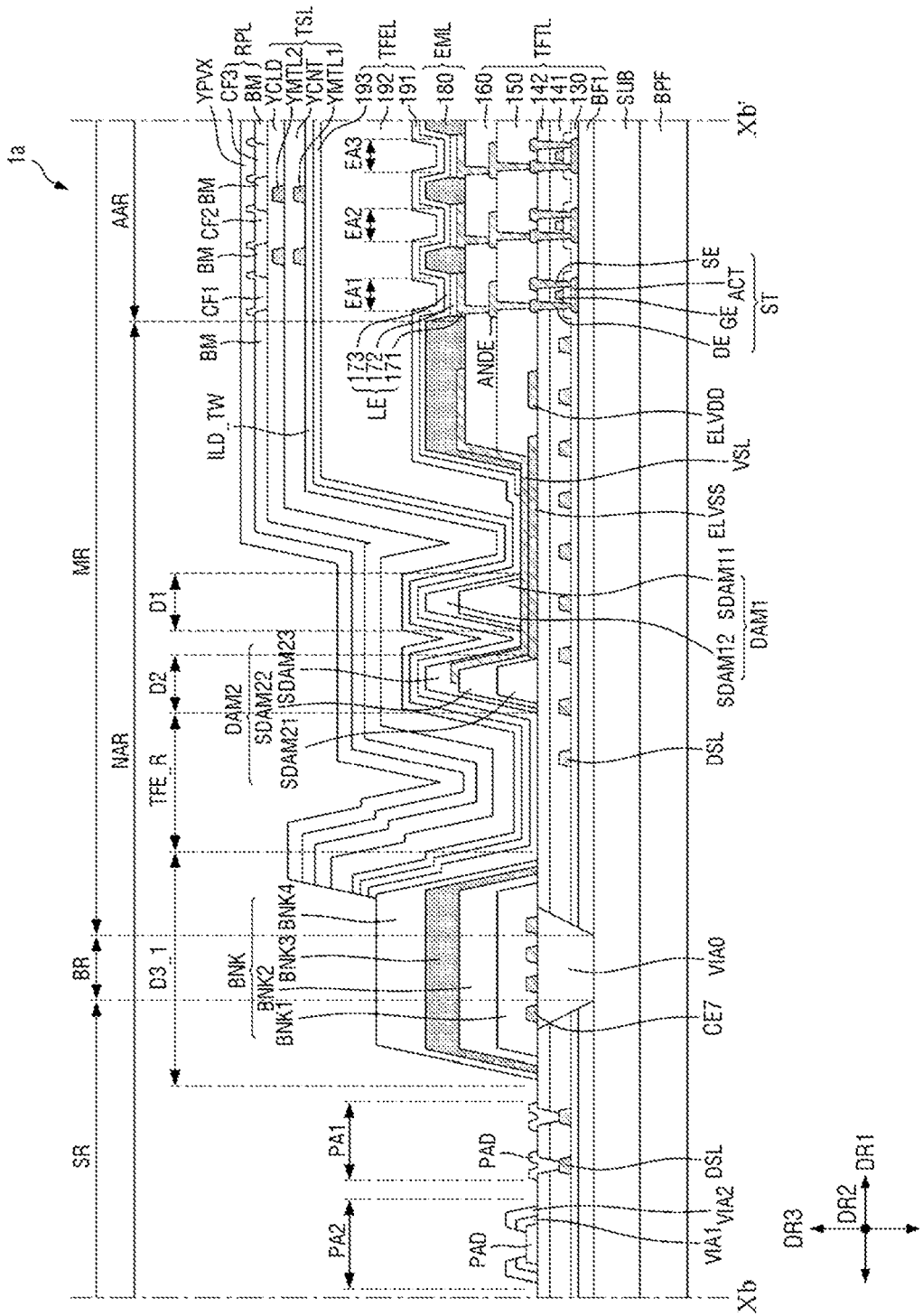
FIG. 12 is a cross-sectional view of a display panel of a display device according to an embodiment.

FIG. 12 is a cross-sectional view of a display panel of a display device according to an embodiment.

Referring to FIG. 12, unlike the embodiment of FIG. 8, a third bank layer BNK3 has a larger width than a second bank layer BNK2 and thus may be disposed to completely cover the second bank layer BNK2. Accordingly, an upper surface and sides of the second bank layer BNK2 may be completely covered by the third bank layer BNK3. Although not shown, a part of the third bank layer BNK3 may be removed from a first region BNK_R0, similar to the cases of FIGS. 7 and 10.

As illustrated in FIG. 12, both ends of the third bank layer BNK3 may be in direct contact with a second interlayer insulating film 142 in a cross-sectional view. Both ends of the third bank layer BNK3 may form a slope on the second interlayer insulating film 142, as illustrated in the left part of FIG. 9B. However, because both ends of the third bank layer BNK3 are covered by the fourth bank layer BNK4, surfaces of the edges of the bank BNK may have a relatively gentle slope on the second interlayer insulating film 142 compared to when the third bank layer BNK3 is an outermost bank layer.

The fourth bank layer BNK4 may have a larger width than the third bank layer BNK3, and the third bank layer BNK3 may be completely covered by the fourth bank layer BNK4. That is, the fourth bank layer BNK4 may be disposed to surround the third bank layer BNK3 so that the third bank layer BNK3 may not be exposed, thus forming an outermost side of the bank BNK.

The embodiment of FIG. 12 is substantially the same as or similar to the embodiments of FIGS. 1 to 11 except for the third bank layer BNK3, and thus, redundant descriptions will be omitted.

Figure 13:
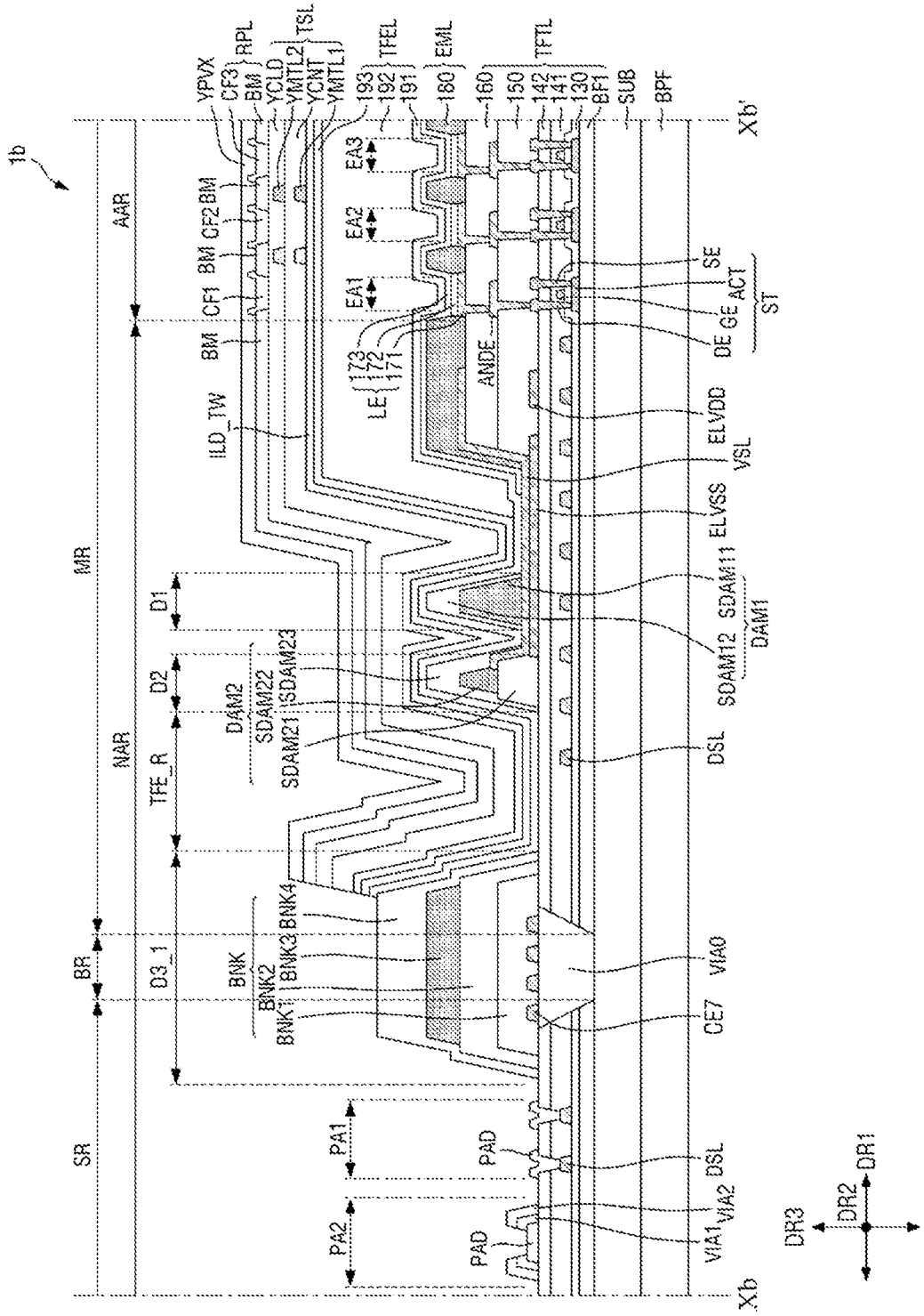
FIG. 13 is a cross-sectional view of a display panel of a display device according to an embodiment.

FIG. 13 is a cross-sectional view of a display panel of a display device according to an embodiment.

Referring to FIG. 13, unlike the embodiment of FIG. 8, a first sub-dam SDAM11 and a fourth sub-dam SDAM22 may be formed of the same material as a pixel defining layer 180 and a third bank layer BNK3. That is, the first sub-dam SDAM11 and the fourth sub-dam SDAM22 may include a light blocking material, like the pixel defining layer 180 and the third bank layer BNK3. In this case, the pixel defining layer 180, the first sub-dam SDAM11, the fourth sub-dam SDAM22, and the third bank layer BNK3 may be formed simultaneously. Accordingly, a process may be simplified and the reflection of external light in an inactive area NAR may be further reduced.

The first sub-dam SDAM11 may be completely covered by a second sub-dam SDAM12, and the fourth sub-dam SDAM22 may be completely covered by a fifth sub-dam SDAM23. In this case, surfaces of edges of the first dam DAM1 and surfaces of edges of the second dam DAM2 may have a relatively gentle slope on a second interlayer insulating film 142, as illustrated in the left part of FIG. 9A.

The embodiment of FIG. 13 is substantially the same as or similar to the embodiments of FIGS. 1 to 11 except for first and fourth sub-dams SDAM11 and SDAM22, and thus, redundant descriptions will be omitted.

According to a display device and a method of manufacturing the display device according to various embodiments, the reflection of external light can be reduced, the occurrence of defects due to residual films can be minimized, and mask alignment can be easily performed.

Although features according to the embodiments are set forth in the above description, other various features are also included in the present disclosure.

In concluding the detailed description, those skilled in the art will appreciate that many variations and modifications can be made to the embodiments without substantially departing from the principles of the inventive concept. Therefore, the disclosed embodiments are used in a generic and descriptive sense only and not for purposes of limitation.

What is claimed is:

1. A display device comprising:
    a substrate;
    an emission layer disposed on the substrate, the emission layer comprising a plurality of emission areas and a pixel defining layer disposed between the plurality of emission areas, the pixel defining layer comprising a light blocking material;
    an encapsulation layer disposed on the emission layer, the encapsulation layer comprising a first inorganic encapsulation film, an organic encapsulation film on the first inorganic encapsulation film, and a second inorganic encapsulation film on the organic encapsulation film;
    a dam surrounding the organic encapsulation film, comprising an organic material, and a plurality of sub-dams; and
    a bank surrounding at least a portion of the dam, the bank comprising a first bank layer, a second bank layer on the first bank layer, a third bank layer on the second bank layer, and a fourth bank layer on the third bank layer, wherein the third bank layer includes the light blocking material.

2. The display device of claim 1, wherein an angle between a surface of an edge of the dam and the substrate is 80° or less.

3. The display device of claim 1, wherein an angle between a surface of an edge of the fourth bank layer and the substrate is 80° or less.

4. The display device of claim 3, wherein the third bank layer comprises a negative photoresist, and
    an outermost sub-dam among the plurality of sub-dams and the fourth bank layer comprise a positive photoresist.

5. The display device of claim 1, wherein the fourth bank layer comprises polyimide.

6. The display device of claim 1, wherein the first inorganic encapsulation film and the second inorganic encapsulation film are disposed on the dam and the bank, and the third bank layer is not in contact with the first inorganic encapsulation film and the second inorganic encapsulation film.

7. The display device of claim 6, wherein ends of the first and second inorganic encapsulation films are on the bank.

8. The display device of claim 1, wherein the bank comprises a first region from which the light blocking material is removed.

9. The display device of claim 8, further comprising a touch wire on the second inorganic encapsulation film,
    wherein the touch wire does not overlap the first region in a thickness direction.

10. The display device of claim 8, wherein a height of the bank in the first region is less than that of the bank in regions excluding the first region.

11. The display device of claim 1, wherein a width of the third bank layer is less than that of the second bank layer.

12. The display device of claim 11, wherein the third bank layer is clad with the fourth bank layer and the fourth bank layer forms an outermost side of the bank, an upper surface and sides of the third bank layer are covered by the fourth bank layer, and a lower surface of the third bank layer contacts an upper surface of the second bank layer.

13. The display device of claim 1, further comprising:
    a first planarization film on the substrate; and
    a second planarization film on the first planarization film,
    wherein the first bank layer comprises a same material as the first planarization film, and the second bank layer comprises a same material as second planarization film.

14. The display device of claim 1, wherein at least one of the plurality of sub-dams comprises a light blocking material.

15. The display device of claim 1, further comprising a polarizing layer disposed on the encapsulation layer and comprising a plurality of color filters.

16. The display device of claim 15, wherein the polarizing layer comprises a light blocking member between the plurality of color filters.

* * * * *